(12) United States Patent
Moon et al.

(10) Patent No.: US 11,696,470 B2
(45) Date of Patent: Jul. 4, 2023

(54) DISPLAY APPARATUS

(71) Applicant: SAMSUNG DISPLAY CO., LTD., Yongin-si (KR)

(72) Inventors: Yeonkeon Moon, Yongin-si (KR); Taesang Kim, Yongin-si (KR); Joonseok Park, Yongin-si (KR); Sangwoo Sohn, Yongin-si (KR); Soyoung Koo, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 93 days.

(21) Appl. No.: 17/246,989

(22) Filed: May 3, 2021

(65) Prior Publication Data

US 2022/0149132 A1    May 12, 2022

(30) Foreign Application Priority Data

Nov. 11, 2020    (KR) .......................... 10-2020-0150513

(51) Int. Cl.
*H01L 27/32*    (2006.01)
*H01L 51/56*    (2006.01)
(Continued)

(52) U.S. Cl.
CPC ......... *H10K 59/1213* (2023.02); *H10K 71/00* (2023.02); *H01L 27/1225* (2013.01);
(Continued)

(58) Field of Classification Search
CPC ............. H01L 27/1233; H01L 27/3262; H01L 27/1251; H01L 27/1225; H01L 27/322;
(Continued)

(56) References Cited

U.S. PATENT DOCUMENTS 8,956,907 B2 * 2/2015 Ono .................. H01L 27/14687
257/225
9,153,699 B2    10/2015 Yamazaki
(Continued)

FOREIGN PATENT DOCUMENTS

KR    1020190020959 A    3/2019
KR    1020200027616 A    3/2020
(Continued)

OTHER PUBLICATIONS

Rongsheng Chen et al., "Self-aligned top-gate InGaZnO thin film transistors using SiO2/Al2O3 stack gate dielectric," Thin Solid Films, 2013, pp. 572-575, vol. 548, Elsevier B.V.

*Primary Examiner* — Nikolay K Yushin
(74) *Attorney, Agent, or Firm* — Cantor Colburn LLP

(57) ABSTRACT

A display apparatus includes a substrate including a display area and a peripheral area outside the display area, a pixel circuit disposed on the substrate in the display area, where the pixel circuit includes a driving thin film transistor and a switching thin film transistor, and a display element connected to the pixel circuit. The driving thin film transistor includes a driving semiconductor layer having a single layer structure, the switching thin film transistor includes a switching semiconductor layer in which a first layer, a second layer, and a third layer, which are oxide semiconductors, are sequentially stacked one on another, and a conductivity of the second layer of the switching semiconductor layer is greater than respective conductivities of the first layer and the third layer of the switching semiconductor layer.

20 Claims, 22 Drawing Sheets

(51) Int. Cl.
*H10K 59/121* (2023.01)
*H10K 71/00* (2023.01)
*H01L 27/12* (2006.01)
*H10K 59/38* (2023.01)
*H10K 59/12* (2023.01)

(52) U.S. Cl.
CPC ...... *H01L 27/1251* (2013.01); *H10K 59/1201* (2023.02); *H10K 59/38* (2023.02)

(58) Field of Classification Search
CPC ........... H01L 29/78696; H01L 29/7869; H01L 29/78648; H01L 29/78633; H01L 51/56; H01L 51/5237; H01L 51/0072; H01L 51/5221; H01L 2227/323; H10K 59/1213; H10K 59/1201; H10K 59/38; H10K 71/00; H10K 71/12; H10K 71/20
See application file for complete search history.

(56) References Cited

U.S. PATENT DOCUMENTS

| | | | |
|---|---|---|---|
| 9,691,799 B2* | 6/2017 | Lee | H01L 27/124 |
| 10,483,404 B2 | 11/2019 | Yamazaki | |
| 10,770,623 B2* | 9/2020 | Kang | H01L 33/18 |
| 10,868,049 B2 | 12/2020 | Park et al. | |
| 10,978,529 B2* | 4/2021 | Morinaga | H01L 27/3262 |
| 2014/0131696 A1* | 5/2014 | Ono | H01L 27/14612 |
| | | | 257/43 |
| 2019/0131492 A1* | 5/2019 | Kang | H01L 51/502 |
| 2020/0089069 A1* | 3/2020 | Morinaga | H01L 27/3279 |
| 2020/0194719 A1 | 6/2020 | Choi et al. | |

FOREIGN PATENT DOCUMENTS

| | | |
|---|---|---|
| KR | 1020200056370 A | 5/2020 |
| KR | 1020200072890 A | 6/2020 |

* cited by examiner

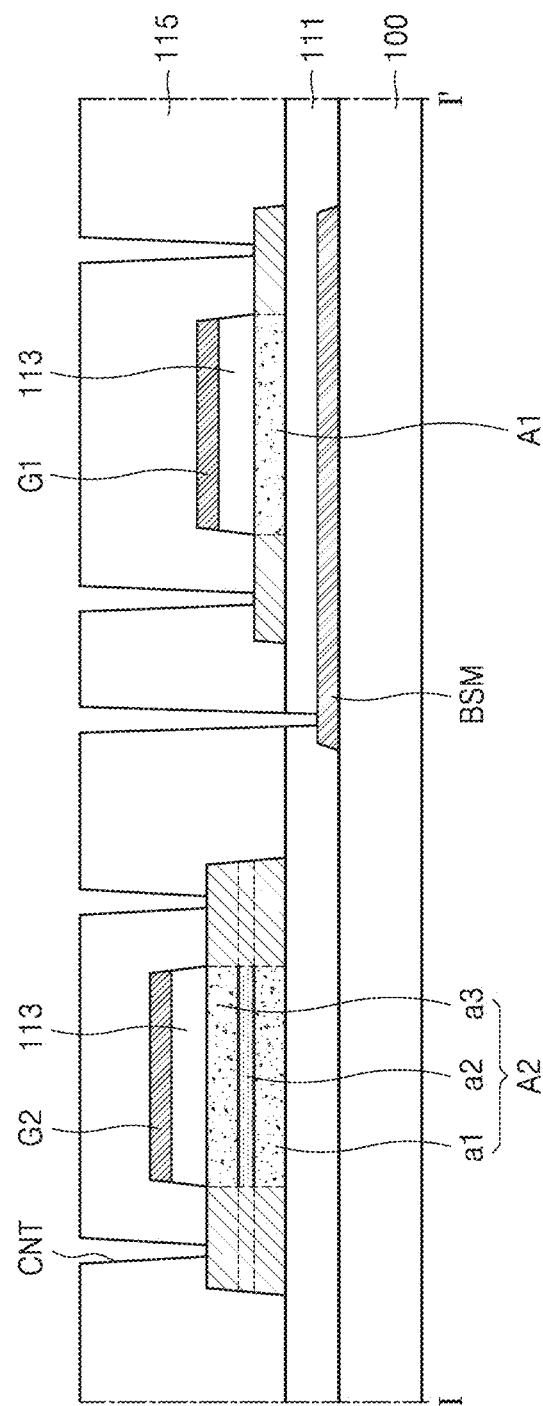

DISPLAY APPARATUS

This application claims priority to Korean Patent Application No. 10-2020-0150513, filed on Nov. 11, 2020, and all the benefits accruing therefrom under 35 U.S.C. § 119, the content of which in its entirety is herein incorporated by reference.

BACKGROUND

1. Field

One or more embodiments relate to a display apparatus.

2. Description of Related Art

A display apparatus visually displays data. Such a display apparatus typically includes a substrate including a display area and a peripheral area. In the display area, scan lines and data lines may be disposed to be insulated from each other, and pixels are arranged. Also, in the display area, a thin film transistor and a pixel electrode electrically connected to the thin film transistor may be arranged corresponding to each pixel. Also, an opposite electrode that is commonly included in the pixels may be located in the display area. In the peripheral area, lines configured to transmit electrical signals to the display area, a scan driver, a data driver, a controller, a pad unit, and the like may be arranged.

Display apparatuses are used in various fields. Accordingly, various designs for improving the quality of display apparatuses have been attempted.

SUMMARY

One or more embodiments provide a display apparatus for realizing high-quality images and increasing an integration degree in a display area, and having a reduced size of a peripheral area.

An embodiment of a display apparatus includes a substrate including a display area and a peripheral area outside the display area, a pixel circuit disposed on the substrate in the display area, where the pixel circuit includes a driving thin film transistor and a switching thin film transistor, and a display element connected to the pixel circuit. In such an embodiment, the driving thin film transistor includes a driving semiconductor layer having a single layer structure. In such an embodiment, the switching thin film transistor includes a switching semiconductor layer in which a first layer, a second layer, and a third layer, which are oxide semiconductors, are sequentially stacked one on another, and a conductivity of the second layer of the switching semiconductor layer is greater than respective conductivities of the first layer and the third layer of the switching semiconductor layer.

In an embodiment, the first layer of the switching semiconductor layer may include a same material as the third layer of the switching semiconductor layer.

In an embodiment, the second layer of the switching semiconductor layer may include at least one selected from indium zinc oxide (InZnO), gallium zinc oxide (GaZnO), aluminum zinc oxide (AlZnO), indium tin gallium oxide (InSnGaO), indium tin zinc oxide (InSnZnO), and indium tin gallium zinc oxide (InSnGaZnO).

In an embodiment, the driving semiconductor layer may include a same material as the first layer of the switching semiconductor layer.

In an embodiment, a thickness of the second layer of the switching semiconductor layer may be less than respective thicknesses of the first layer and the third layer of the switching semiconductor layer.

In an embodiment, a resistivity of the second layer may be in a range from about 350 micro-ohmmeter (μΩm) to about 990 μΩm.

In an embodiment, a channel length of the switching semiconductor layer may be less than a channel length of the driving semiconductor layer.

In an embodiment, the display apparatus may further include an embedded driving circuit disposed on the substrate in the peripheral area, where the embedded driving circuit may include a peripheral thin film transistor.

In an embodiment, the peripheral thin film transistor may include a peripheral semiconductor layer in which a first layer, a second layer, and a third layer, which are oxide semiconductors, are sequentially stacked one on another, and a conductivity of the second layer of the peripheral semiconductor layer may be greater than respective conductivities of the first layer and the third layer of the peripheral semiconductor layer.

In an embodiment, the peripheral thin film transistor may include a gate electrode disposed on an upper portion of the peripheral semiconductor layer and a lower gate electrode disposed on a lower portion of the peripheral semiconductor layer.

In an embodiments the display apparatus may further include a color conversion layer disposed to correspond to an emission area of the display element, where the color conversion layer may include a quantum dot.

According to an embodiment, a display apparatus includes a substrate including a display area and a peripheral area outside the display area, a pixel circuit disposed on the substrate in the display area, where the pixel circuit includes a driving thin film transistor, a display element connected to the pixel circuit, and an embedded driving circuit disposed on the substrate in the peripheral area, where the embedded driving circuit includes a peripheral thin film transistor. In such an embodiment, the driving thin film transistor includes a driving semiconductor layer having a single layer structure, the peripheral thin film transistor includes a peripheral semiconductor layer in which a first layer, a second layer, and a third layer, which are oxide semiconductors, are sequentially stacked one on another, and a conductivity of the second layer of the peripheral semiconductor layer is greater than respective conductivities of the first layer and the third layer of the peripheral semiconductor layer.

In an embodiment, the first layer of the peripheral semiconductor layer may include a same material as the third layer of the peripheral semiconductor layer.

In an embodiment, the second layer of the peripheral semiconductor layer may include at least one selected from indium zinc oxide (InZnO), gallium zinc oxide (GaZnO), aluminum zinc oxide (AlZnO), indium tin gallium oxide (InSnGaO), indium tin zinc oxide (InSnZnO), and indium tin gallium zinc oxide (InSnGaZnO).

In an embodiment, the driving semiconductor layer may include a same material as the first layer of the peripheral semiconductor layer.

In an embodiment, a thickness of the second layer of the peripheral semiconductor layer may be less than respective thicknesses of the first layer and the third layer of the peripheral semiconductor layer.

In an embodiment, the peripheral thin film transistor may include a gate electrode disposed on an upper portion of the peripheral semiconductor layer, and a lower gate electrode disposed on a lower portion of the peripheral semiconductor layer.

In an embodiment, a channel length of the peripheral semiconductor layer may be less than a channel length of the driving semiconductor layer.

In an embodiment, the pixel circuit may further include a switching thin film transistor, and the switching thin film transistor may include a switching semiconductor layer having a multilayered structure.

In an embodiment, the embedded driving circuit may provide a scan signal to the pixel circuit.

BRIEF DESCRIPTION OF THE DRAWINGS

The above and other features of embodiments of the disclosure will be more apparent from the following description taken in conjunction with the accompanying drawings, in which:

FIGS. 6A to 6J are cross-sectional views sequentially illustrating a manufacturing method of a display apparatus, according to an embodiment;

DETAILED DESCRIPTION

Figure 1:
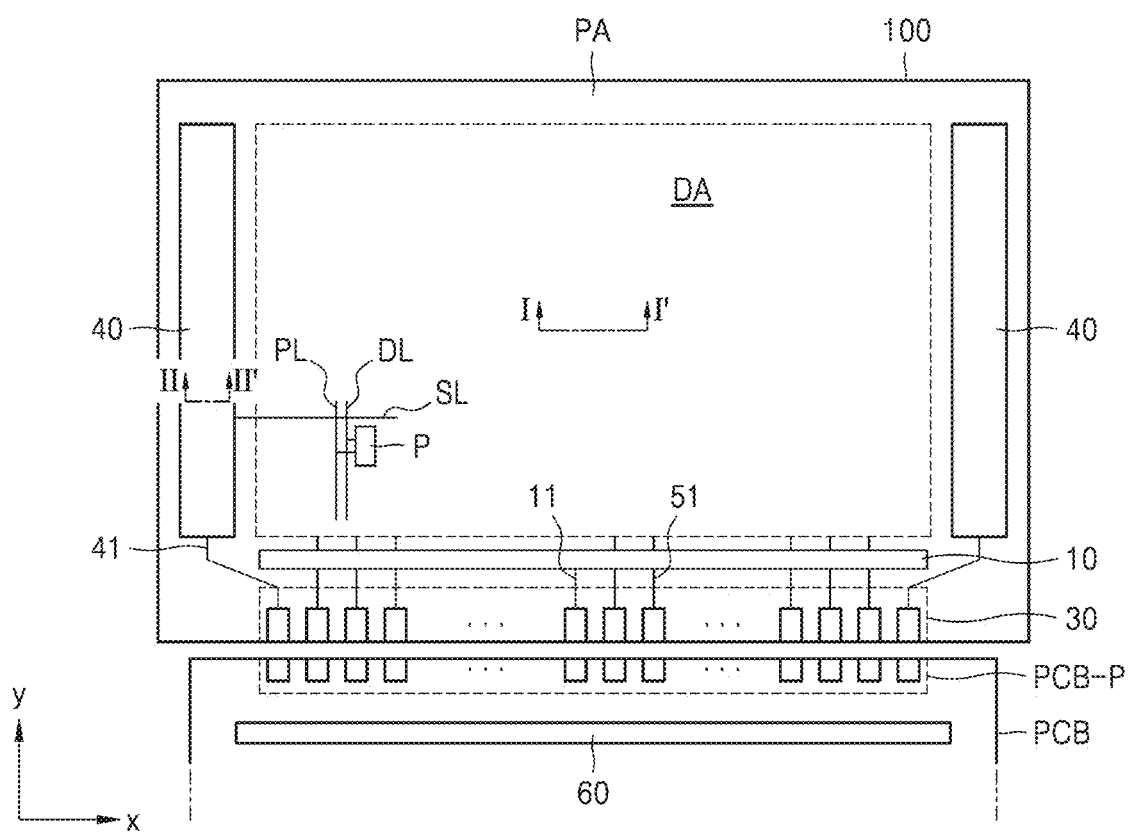
FIG. 1 is a schematic plan view of a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

It will be understood that when a component, such as a layer, a film, a region, or a plate, is referred to as being "connected to" another component, the component can be directly connected to the other component or intervening components may be present therebetween. It will be understood that when a component, such as a layer, a film, a region, or a plate, is referred to as being "electrically connected to" another component, the component can be directly electrically connected to the other component or intervening components may be present therebetween for indirect electrical connection.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Herein, embodiments of a display apparatus may include an organic light emitting display apparatus, an inorganic light emitting display apparatus, a quantum dot light emitting display apparatus, a field emission display apparatus, a surface-conduction electron-emitter display apparatus, a plasma display apparatus, and the like.

Hereinafter, for convenience of description, embodiments of the invention where the display apparatus is an organic light-emitting display apparatus will be described in detail with reference to the accompanying drawings, but not being limited thereto. It will be understood that embodiments of the invention includes other various types of display apparatus described above.

FIG. 1 is a schematic plan view of a display apparatus according to an embodiment.

Referring to FIG. 1, an embodiment of the display apparatus includes a substrate 100 including a display area DA and a peripheral area PA around the display area DA. The display apparatus may provide a certain image by using light emitted from pixels P arranged in the display area DA.

The display area DA includes pixels P connected to scan lines SL extending in an x direction and data lines DL extending in a y direction crossing the x direction. Each pixel P is connected to a driving power line PL extending in the y direction.

Each pixel P may include a display element such as an organic light-emitting diode OLED. Each pixel P may emit, for example, red light, green light, blue light, or white light from the organic light-emitting diode OLED. In an embodiment, the pixel P may be understood as a sub-pixel emitting any one of red light, green light, blue light, and white light, as described above. In an embodiment, the organic light-emitting diodes OLED included in the pixels P emit light having a same color, and colors of light emitted from the pixels P may be realized by color filters, etc. arranged on the organic light-emitting diodes OLED.

Each pixel P may be electrically connected to embedded circuits arranged in the peripheral area PA. In the peripheral area PA, embedded driving circuits 40, a terminal 30, a first power supply line 10, and a second power supply line (not shown) may be arranged.

The embedded driving circuit 40 may include thin film transistors and may provide scan signals to respective pixels P through the scan line SL. The embedded driving circuits 40 may be arranged on both opposing sides of the display area DA. In an embodiment, some of the pixels P arranged in the display area DA may be electrically connected to the embedded driving circuit 40 on a left side of the display area DA, and the others of the pixels P may be electrically connected to the embedded driving circuit 40 on a right side of display area DA. In an alternative embodiment, the embedded driving circuit 40 may be only on one side of the display area DA.

The terminal 30 may be on one side of the substrate 100. The terminal 30 may not be covered by an insulating layer to be exposed, thus being electrically connected to a printed circuit board PCB. A terminal PCB-P of the printed circuit board PCB may be electrically connected to the terminal 30.

In an embodiment, the printed circuit board PCB may be configured to transmit a signal of a controller (not shown) or power to the terminal 30. The controller may provide a driving voltage to the first power supply line 10 through a first connection line 11. The driving voltage may be provided to each pixel P through the driving power line PL connected to the first power supply line 10. In such an embodiment, the controller may provide a common voltage to the second power supply line (not shown). The common voltage may be provided to an opposite electrode of the pixel P connected to the second power supply line.

The control signal generated by the controller may be transmitted to the embedded driving circuit 40 through a third connection line 41.

The printed circuit board PCB may include a data driving circuit 60. The data driving circuit 60 is electrically connected to the data line DL. A data signal of the data driving circuit 60 may be provided to each pixel P through a connection line 51 connected to the terminal 30 and the data line DL connected to the connection line 51. In an alternative embodiment, the data driving circuit 60 may be disposed on the substrate 100. In one embodiment, for example, the data driving circuit 60 may be disposed between the terminal 30 and the first power supply line 10.

Figure 2A:
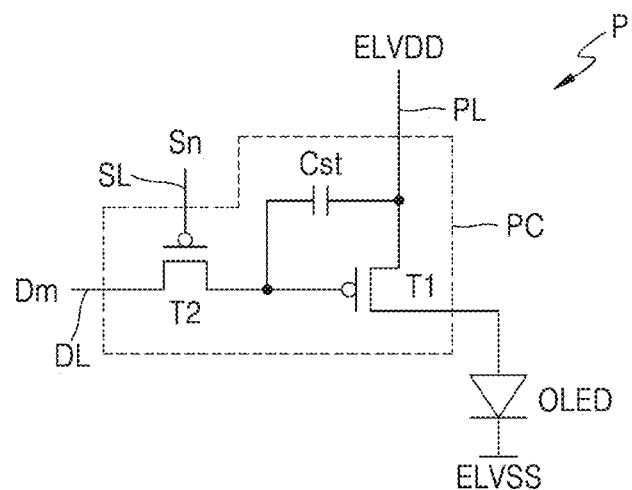
FIGS. 2A and 2B are equivalent circuit diagrams of one of pixels of a display apparatus, according to an embodiment.
Figure 2B:
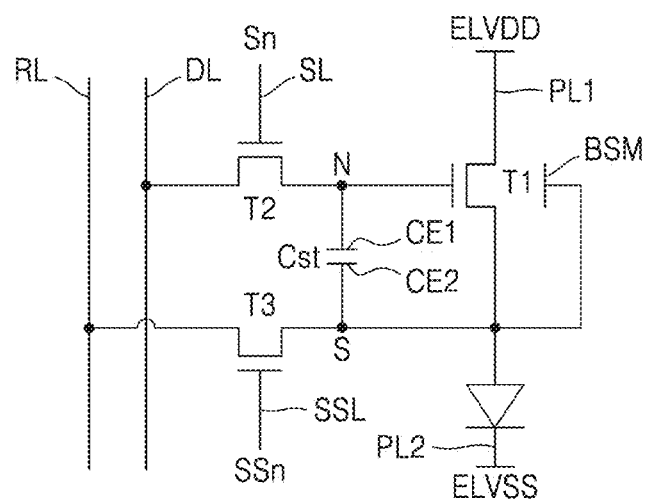

FIGS. 2A and 2B are equivalent circuit diagrams of one of pixels of a display apparatus, according to an embodiment.

Referring to FIG. 2A, an embodiment of each pixel P includes a pixel circuit PC connected to the scan line SL and the data line DL and the organic light-emitting diode OLED connected to the pixel circuit PC.

In such an embodiment, the pixel circuit PC includes a driving thin film transistor T1, a switching thin film transistor T2, and a storage capacitor Cst. The switching thin film transistor T2 is connected to the scan line SL and the data line DL and configured to transmit a data signal Dm, which is input through the data line DL, to the driving thin film transistor T1 in response to a scan signal Sn input through the scan line SL.

The storage capacitor Cst is connected to the switching thin film transistor T2 and the driving voltage line PL and stores therein a voltage corresponding to a difference between a voltage transmitted from the switching thin film transistor T2 and a first power voltage ELVDD (or a driving voltage) provided to the driving power line PL.

The driving thin film transistor T1 may be connected to the storage capacitor Cst and the driving power line PL and may control a driving current flowing in the organic light-emitting diode OLED from the driving power line PL, in response to a value of the voltage stored in the storage capacitor Cst. The organic light-emitting diode OLED may emit light having a brightness, corresponding to the driving current.

FIG. 2A illustrates an embodiment where the pixel circuit PC includes two thin film transistors and a single storage capacitor, but embodiments are not limited thereto.

Referring to FIG. 2B, an alternative embodiment of each pixel P includes the organic light-emitting diode OLED and the pixel circuit PC including thin film transistors driving the organic light-emitting diode OLED. The pixel circuit PC may include the driving thin film transistor T1, the switching thin film transistor T2, a sensing thin film transistor T3, and the storage capacitor Cst.

In such an embodiment, a gate electrode of the switching thin film transistor T2 may be connected to the scan line SL, a source electrode of the switching thin film transistor T2 may be connected to the data line DL, and a drain electrode of the switching thin film transistor T2 may contact a first electrode CE1 of the capacitor Cst.

Accordingly, the switching thin film transistor T2 provides a data voltage of the data line DL to a first node N1, in response to the scan signal Sn from the scan line SL of each pixel P.

A gate electrode of the driving thin film transistor T1 may be connected to the first node N, a source electrode of the driving thin film transistor T1 may be connected to the first power line PL1 configured to transmit the driving power voltage ELVDD, and a drain electrode of the driving thin film transistor T1 may be connected to an anode of the organic light-emitting diode OLED.

Accordingly, the driving thin film transistor T1 may adjust the amount of current flowing in the organic light-emitting diode OLED, based on a voltage Vgs between the source and gate electrodes of the driving thin film transistor T1, that is, a voltage between the driving power voltage ELVDD and the first node N.

A gate electrode of the sensing thin film transistor T3 is connected to a sensing control line SSL, a source electrode of the sensing thin film transistor T3 is connected to a second node S, and a drain electrode of the sensing thin film transistor T3 is connected to a reference voltage line RL. In an alternative embodiment, the sensing thin film transistor T3 may be controlled by the scan line SL instead of the sensing control line SSL.

The sensing thin film transistor T3 may sense a potential of the anode of the organic light-emitting diode OLED. The sensing thin film transistor T3 provides a pre-charging voltage from the reference voltage line RL to the second node S in response to a sensing signal SSn from the sensing control line SSL or provides a voltage of the anode of the organic light-emitting diode OLED to the reference voltage line RL during a sensing period.

The first electrode CE1 of the storage capacitor Cst is connected to the first node N, and the second electrode CE2 of the storage capacitor Cst is connected to the second node S. The storage capacitor Cst charges a voltage corresponding to a difference between voltages respectively provided to the first and second nodes N and S and provides the charged voltage as a driving voltage of the driving thin film transistor T1. In one embodiment, for example, the storage capacitor Cst may charge a voltage that is a difference between a pre-charging voltage Vpre and a voltage of the data signal Dm provided to each of the first and second nodes N and S.

A bias electrode BSM may be disposed to correspond to the driving thin film transistor T1 and may be connected to a source electrode of the sensing thin film transistor T3. The bias electrode BSM may receive a voltage in connection with a potential of the source electrode of the sensing thin film transistor T3, and thus, the driving thin film transistor T1 may be stabilized. In an alternative embodiment, the bias electrode BSM may not be connected to the source electrode of the sensing thin film transistor T3, but may be connected to a separate bias line.

The opposite electrode (e.g., a cathode) of the organic light-emitting diode OLED receives a common power voltage ELVSS. The organic light-emitting diode OLED emits light by receiving the driving current from the driving thin film transistor T1.

FIG. 2B illustrates an embodiment where each pixel P includes the scan line SL, the sensing control line SSL, the data line DL, the reference voltage line RL, the first power supply line PL1, and a second power line PL2, but embodiments are not limited thereto. In one embodiment, for example, at least one selected from the scan line SL, the sensing control line SSL, the data line DL, and/or the reference voltage line RL, the first power supply line PL1, and the second power line PL2 may be shared by a neighboring pixel.

The pixel circuit PC is not limited to those shown in FIGS. 2A and 2B, e.g., by the number of thin film transistors, the number of storage capacitors, and a circuit design described with reference to FIGS. 2A and 2B, but the number of thin film transistors, the number of storage capacitors, and a circuit design may be variously modified.

Figure 3:
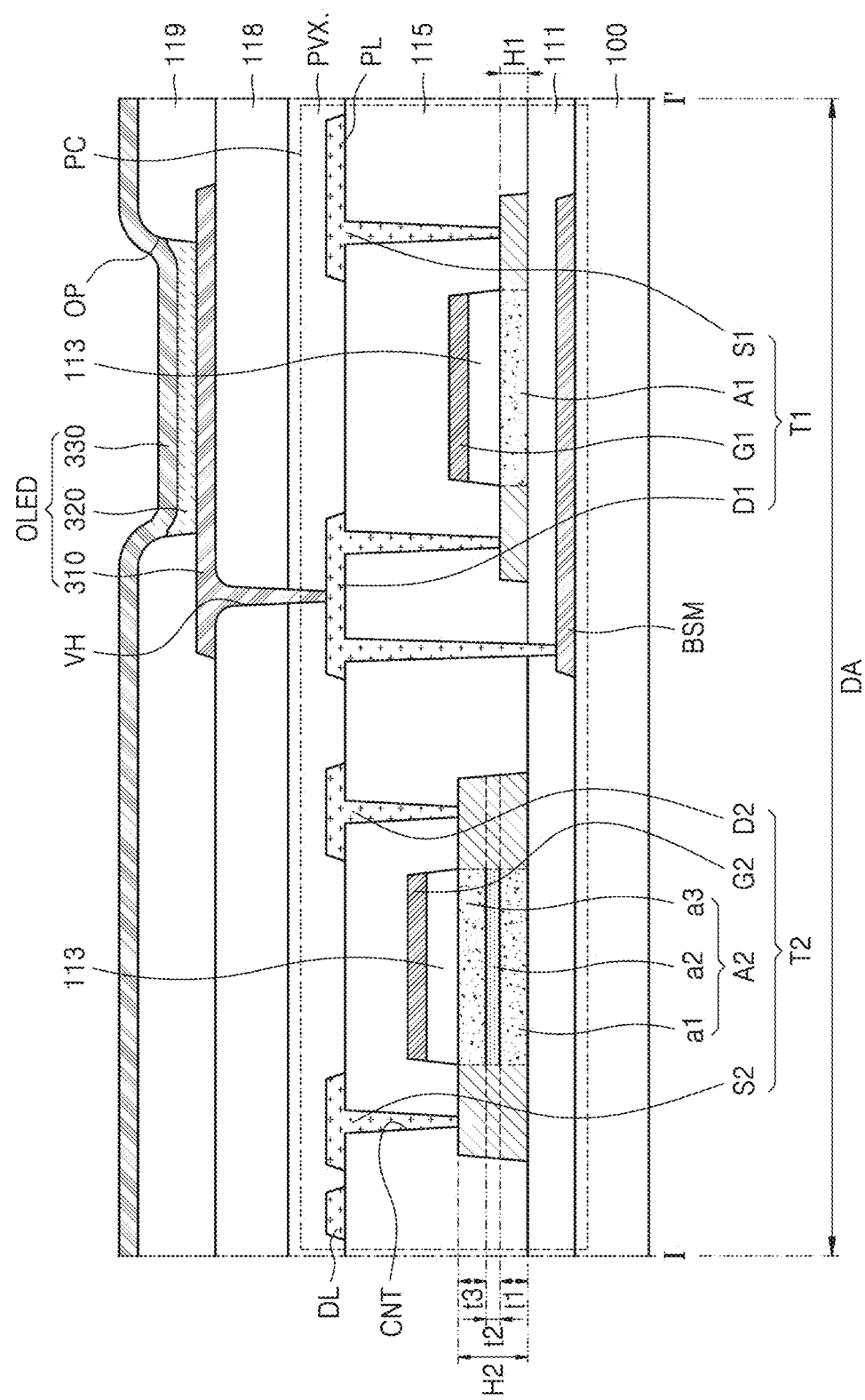
FIG. 3 is a schematic cross-sectional view of a display apparatus according to an embodiment, take along line I-I' of FIG. 1.

FIG. 3 is a schematic cross-sectional view of a display apparatus according to an embodiment, taken along line I-I' of FIG. 1.

Referring to FIG. 3, an embodiment of the display apparatus includes the pixel circuit PC on the substrate 100 in the display area DA and the organic light-emitting diode OLED connected to the pixel circuit PC as a display element. The pixel circuit PC includes the driving thin film transistor T1 and the switching thin film transistor T2.

In an embodiment, the driving thin film transistor T1 may include a driving semiconductor layer A1 that has a single layer structure, and the switching thin film transistor T2 may include a switching semiconductor layer A2 that has a multilayered structure.

The switching thin film transistor T2 may include a switching semiconductor layer A2 in which a first layer a1, a second layer a2, and a third layer a3, which are oxide semiconductors, are sequentially stacked one on another, and the conductivity of the second layer a2 may be greater than the respective conductivities of the first layer a1 and the third layer a3.

In an embodiment, as shown in FIG. 3, the driving thin film transistor T1 and the switching thin film transistor T2 of the pixel circuit PC of each pixel P of FIGS. 2A and 2B are arranged on the substrate 100 In the display area DA. For convenience of description, a configuration of the display apparatus shown in FIG. 3 will be described in a stacked order.

The substrate 100 may include a glass material, a ceramic material, a metal material, polymer resin such as polyimide, or the like. The substrate 100 may have a single-layer structure or a multilayered structure, each layer including at least one selected from the aforementioned materials. In an embodiment, where the substrate 100 has a multilayered structure, the substrate 100 may further include an inorganic layer.

In an embodiment, the bias electrode BSM may be disposed corresponding to the driving thin film transistor T1 on the substrate 100. In such an embodiment, the bias electrode BSM may overlap the driving semiconductor layer A1 of the driving thin film transistor T1 in a thickness direction of the substrate 100. A voltage may be applied to the bias electrode BSM. In one embodiment, for example, the bias electrode BSM may be connected to the source electrode of the sensing thin film transistor T3 (see FIG. 2B), and a voltage of the source electrode of the sensing thin film transistor T3 may be applied to the bias electrode BSM. In such an embodiment, the bias electrode BSM may prevent external light from reaching the driving and switching semiconductor layers A1 and A2. Accordingly, features of the driving thin film transistor T1 may be stabilized. Alternatively, the bias electrode BSM may be omitted.

In an embodiment, a buffer layer 111 may cover the bias electrode BSM and may be disposed on the entire substrate 100. The buffer layer 111 may prevent or reduce the penetration of impurities from the substrate 100, etc. into the driving and switching semiconductor layers A1 and A2. The buffer layer 111 may include at least one selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), and the like. In an embodiment, a lower buffer layer (not shown) may be further disposed between the substrate 100 and the bias electrode BSM.

in an embodiment, the driving semiconductor layer A1 of the driving thin film transistor T1 and the switching semiconductor layer A2 of the switching thin film transistor T2 may be disposed on the buffer layer 111.

The driving semiconductor layer A1 may have a single layer structure, and the switching semiconductor layer A2 may have a multilayered structure in which the first layer a1, the second layer a2, and the third layer a3 are sequentially stacked one on another.

The driving semiconductor layer A1 and the switching semiconductor layer A2 may each include an oxide semiconductor material. In one embodiment, for example, the driving semiconductor layer A1 and the switching semiconductor layer A2 may each include an oxide of at least one material selected from indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

In an embodiment, the first layer a1, the second layer a2, and the third layer a3 of the switching semiconductor layer A2 include oxide semiconductors, and the second layer a2 may include a material having a greater conductivity than materials of the first and third layers a1 and a3.

In an embodiment, the first layer a1 and the third layer a3 may each include indium gallium zinc oxide (InGaZnO), and the second layer a2 may include at least one selected from indium zinc oxide (InZnO), gallium zinc oxide (GaZnO), aluminum zinc oxide (AlZnO), indium tin gallium oxide (InSnGaO), indium tin zinc oxide (InSnZnO), and indium tin gallium zinc oxide (InSnGaZnO).

In such an embodiment where the second layer a2 having the great conductivity is disposed between the first layer a1 and the third layer a3, the switching thin film transistor T2 may have high mobility.

When the switching semiconductor layer A2 is a single layer that is the first layer a1, the mobility of carriers may be significantly low. Also, when the switching semiconductor layer A2 has a two-layer structure of the first layer a1/the second layer a2 instead of a three-layer structure in which the second layer a2 is disposed between the first layer a1 and the third layer a3, electrons may move to an interface of the first layer a1 and the second layer a2, and the mobility may not be secured.

In an embodiment, the second layer a2 having the great conductivity is disposed between the first layer a1 and the third layer a3, and thus, the electrons may move to the interface of the first layer a1 and the second layer a2, an interface of the second layer a2 and the third layer a3, and the inside of the second layer a2 such that the high mobility of electrons, that is, high conductivity, is effectively secured.

A thickness t2 of the second layer a2 may be less than a thickness t1 of the first layer a1 and a thickness t3 of the third layer a3. In an embodiment, the second layer a2 may have a thickness at which the second layer a2 has a certain resistivity to prevent the current from flowing while the switching thin film transistor T2 is off. In one embodiment, for example, a resistivity of the second layer a2 may be in a range from about 350 micro-ohmmeter (μΩm) to about 990 μΩm. Accordingly, the thickness t2 of the second layer a2 may be less than the thickness t1 of the first layer a1 and the thickness t3 of the third layer a3. In an embodiment, the thickness t2 of the second layer a2 may be in a range from about 40 angstrom (Å) to about 70 Å, and the thicknesses t1 and t3 of the first and third layers a1 and a3 may each be in a range from about 100 Å to about 200 Å.

The driving semiconductor layer A1 may include a same material as the first layer a1. Since it is desired to accurately control a gradation of light emitted from the organic light-emitting diode OLED by securing a driving range instead of the high mobility of electrons, the driving semiconductor layer A1 of the driving thin film transistor T1 may be a single layer.

In an embodiment, the driving semiconductor layer A1 may include a same material as the first layer a1 of the switching semiconductor layer A2, and thus, a thickness H1 of the driving semiconductor layer A1 may be the same as the thickness t1 of the first layer a1. In such an embodiment, the thickness H1 of the driving semiconductor layer A1 may be less than a thickness H2 of the switching semiconductor layer A2.

The driving semiconductor layer A1 and the switching semiconductor layer A2 may each include a channel area and source and drain areas disposed on opposing sides of the channel area.

A gate insulating layer 113 may be disposed corresponding to the channel areas of the driving semiconductor layer A1 and the switching semiconductor layer A2. In an embodiment, the gate insulating layer 113 may be patterned corresponding to the channel areas of the driving semiconductor layer A1 and the switching semiconductor layer A2. The gate insulating layer 113 may include an inorganic insulating material. The gate insulating layer 113 may include $SiO_2$, $SiN_x$, SiON, $Al_2O_3$, $TiO_2$, $Ta_2O_5$, $HfO_2$, $ZnO_2$, or the like.

Gate electrodes G1 and G2 are disposed on the gate insulating layer 113. The gate electrodes G1 and G2 may be patterned simultaneously with the gate insulating layer 113. Accordingly, side surfaces of the gate electrodes G1 and G2 may contact a side surface of the gate insulating layer 113. The gate electrodes G1 and G2 may include at least one selected from molybdenum (Mo), aluminum (Al), copper (Cu), titanium (Ti), and the like and may have a single layer structure or a multilayer structure.

An interlayer insulating layer 115 may cover the gate electrodes G1 and G2. The interlayer insulating layer 115 may include $SiO_2$, $SiN_x$, SiON, $Al_2O_3$, $TiO_2$, $Ta_2O_5$, $HfO_2$, $ZnO_2$, or the like.

In an embodiment, a driving source electrode S1 and a driving drain electrode D1 of the driving thin film transistor T1, a switching source electrode S1 and a switching drain electrode D2 of the switching thin film transistor T2, the data line DL, and the driving power line PL may be arranged on the interlayer insulating layer 115.

The driving source electrode S1 and the driving drain electrode D1 of the driving thin film transistor T1, the switching source electrode S2 and the switching drain electrode D2 of the switching thin film transistor T2, the data line DL, and the driving power line PL may include a conductive material including Mo, Al, Cu, Ti, or the like, and may each have a layer structure or a multilayer structure, each layer including at least one selected from the above material(s). The driving and switching source electrodes S1 and S2 and the driving and switching drain electrodes D1 and D2 may contact the source or drain area of the driving and switching semiconductor layers A1 and A2 through contact holes defined through the interlayer insulating layer 115. In an embodiment, the driving drain electrode D1 may contact the bias electrode BSM through a contact hole defined through the interlayer insulating layer 115 and the buffer layer 111.

The driving source electrode S1 and the driving drain electrode D1 of the driving thin film transistor T1, the switching source electrode S2 and the switching drain electrode D2 of the switching thin film transistor T2, the data line DL, and the driving power line PL may be covered by a protection layer PVX.

The protection layer PVX may include an inorganic insulating layer or inorganic insulating layers including SiNx and SiOx. Alternatively, the protection layer PVX may include an organic insulating layer. The protection layer PVX may cover and protect some lines arranged on the interlayer insulating layer 115. In some regions (e.g., part of a peripheral area) of the substrate 100, lines (not shown), which are formed in a same process as the data line DL, may be exposed. Exposed portions of the lines may be damaged by an etchant used to pattern a pixel electrode 310 described below. In an embodiment, the protection layer PVX covers the data line DL and at least some of the lines, which are formed in the same process as the data line DL, and thus, the lines may not be damaged while the pixel electrode 310 is patterned.

A planarization layer 118 may be disposed on the protection layer PVX, and the organic light-emitting diode OLED may be disposed on the planarization layer 118.

The planarization layer 118 may have a single layer structure or a multilayer structure, each layer including an organic material, and may provide a flat upper surface. The planarization layer 118 may include a general-purpose polymer such as benzocyclobutene ("BOB"), polyimide, hexamethyldisiloxane ("HMDSO"), polymethylmethacrylate ("PMMA") or polystyrene ("PS"), a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, and a blend thereof.

In an embodiment, the organic light-emitting diode OLED is disposed on the planarization layer 118 in the display area DA of the substrate 100. The organic light-emitting diode OLED includes the pixel electrode 310, an intermediate layer 320 including an organic emission layer, and an opposite electrode 330.

The pixel electrode 310 may be a (semi-transmissive) light-transmissive electrode or a reflection electrode. In an embodiment, the pixel electrode 310 may include a reflection layer including Ag, Mg, Al, Pt, Pd, Au, Ni, Nd, Ir, Cr, and a combination thereof, and a transparent or translucent electrode layer disposed on the reflection layer. The transparent or translucent electrode layer may include at least one material selected from indium tin oxide ("ITO"), indium zinc oxide (InZnO), zinc oxide (ZnO), indium oxide ($In_2O_3$), indium gallium oxide ("IGO"), and aluminum zinc oxide (AlZnO). In an embodiments the pixel electrode 310 may have a multilayer structure of ITO/Ag/ITO.

A pixel-defining layer 119 may be disposed on the planarization layer 118, and the pixel-defining layer 119 may define an emission area of a pixel by an opening defined therethrough corresponding to each sub-pixel in the display area DA, that is, a first opening OP1 exposing at least a central portion of the pixel electrode 310. In an embodiment, the pixel-defining layer 119 may prevent arcs, etc. from being generated at edges of the pixel electrode 310 by increasing a distance between the edges of the pixel electrode 310 and the opposite electrode 330 above the pixel electrode 310.

The pixel-defining layer 119 may include at least one organic insulating material selected from polyimide, polyamide, acryl resin, BCB, and phenol resin and may be formed by using a spin coating method, etc.

The intermediate layer 320 of the organic light-emitting diode OLED may include the organic emission layer. The organic emission layer may include an organic material including a fluorescent or phosphorescent material that emits red light, green light, blue light, or white light. The organic emission layer may include a low-molecular weight organic material or a high-molecular weight organic material, and on and under the organic emission layer, functional layers such as a hole transport layer ("HT"L), a hole injection layer ("HIL"), an electron transport layer ("ETL"), and an electron injection layer ("EIL") may be selectively disposed. The intermediate layer 320 may be disposed respectively corresponding to the pixel electrodes 310. However, embodiments are not limited thereto. Various modifications may be made to the intermediate layer 320. In one embodiment, for example, the intermediate layer 320 may be integrally formed over the pixel electrodes 310.

The opposite electrode 330 may be a light-transmissive electrode or a reflection electrode. In an embodiment, the opposite electrode 330 may be a transparent or translucent electrode and may be a metal thin film having a low work function that includes Li, Ca, LiF/Ca, LiF/Al, Al, Ag, Mg, and a combination thereof. Also, a transparent conductive oxide ("TCO") film such as ITO, InZnO, ZnO, or $In_2O_3$ may be further disposed on the metal thin film. The opposite electrode 330 may be disposed over the display area DA and the peripheral area PA and on upper portions of the intermediate layer 320 and the pixel-defining layer 119. The opposite electrode 330 may be integrally formed in the organic light-emitting diodes OLED and may correspond to the pixel electrodes 310.

In an embodiment, as illustrated in FIG. 3, the pixel electrode 310 may be directly connected to the driving drain electrode D1 of the driving thin film transistor T1 through the contact hole and may be electrically connected to the driving drain electrode D1 through an intermedia medium such as a connection electrode.

Figure 4:
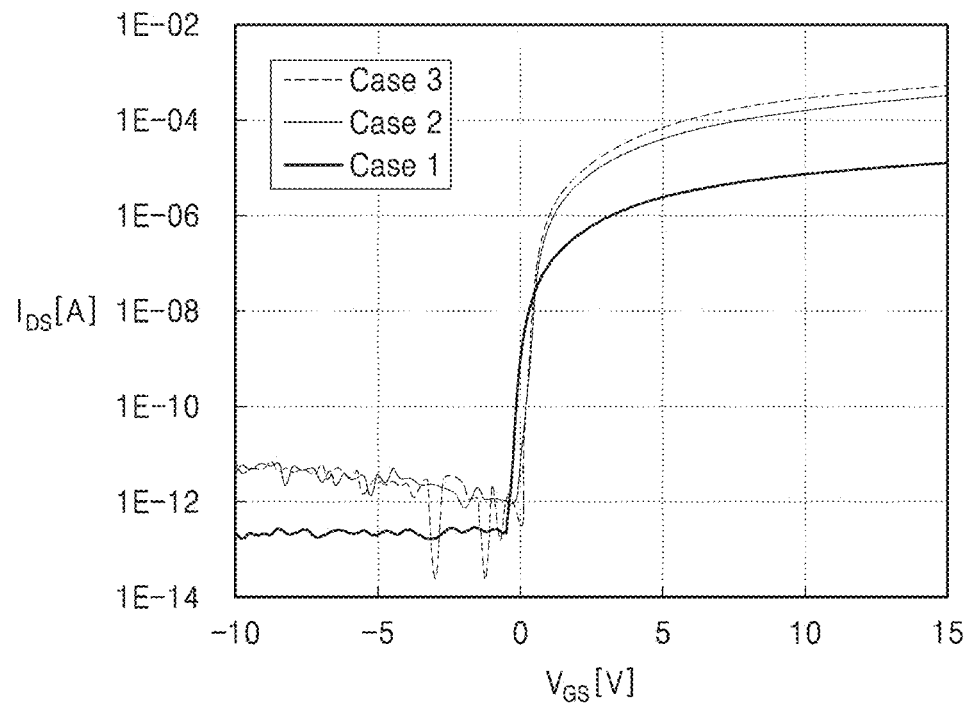
FIGS. 4 and 5 are graphs illustrating characteristics of a thin film transistor including a single oxide semiconductor layer and a switching thin film transistor according to an embodiment.
Figure 5:
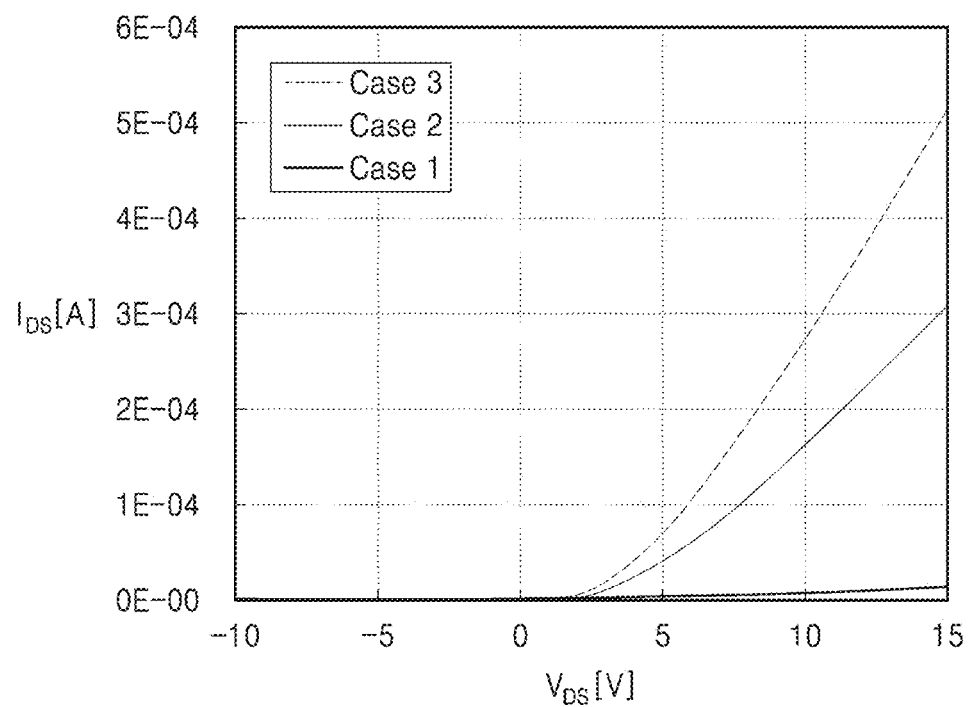

FIGS. 4 and 5 are graphs illustrating characteristics of a thin film transistor including a single oxide semiconductor layer and a switching thin film transistor according to an embodiment. FIG. 4 is a graph showing drain current $I_{DS}$ versus gate voltage $V_{GS}$, and FIG. 5 is a graph showing drain current $I_{DS}$ versus drain source voltage $V_{DS}$.

In FIGS. 4 and 5, Case 1 is directed to a thin film transistor that includes a single semiconductor layer including indium gallium zinc oxide (InGaZnO) and has a single-gate structure in which one gate electrode is disposed on or under the semiconductor layer.

Case 2 is directed to a thin film transistor that includes a semiconductor layer, which has a three-layer structure of InGaZnO/InSnGaZnO/InGaZnO, and has the single-gate structure in which one gate electrode is disposed on or under the semiconductor layer.

Case 3 is directed to a thin film transistor that includes a semiconductor layer, which has a three-layer structure of InGaZnO/InSnGaZnO/InGaZnO, and has a double-gate structure in which two gate electrodes are disposed on and under the semiconductor layer.

Dimensions of the thin film transistors of Case 1 to Case 3 are the same except for the number of layers included in the semiconductor layer.

Referring to the graphs of FIGS. 4 and 5, the drain currents $I_{DS}$ of Case 2 and Case 3 are greater than the drain current $I_{DS}$ of Case 1 under the same conditions. That is, the electron mobility is high when the semiconductor layer has the three-layer structure.

Referring to the graph of FIG. 5, when the source-drain voltage $V_{DS}$ is about 15 volts (V), the drain current $I_{DS}$ of Case 1 may be about 1.28E-05 ampere (A), the drain current $I_{DS}$ of Case 2 may be about 3.11E-04 A, and the drain current $I_{DS}$ of Case 3 may be about 5.15E-04 A. When the drain currents $I_{DS}$ of Case 1 to Case 3 are expressed as a ratio, the ratio may be 1:2.43:4.02, which means that using a semiconductor layer having a three-layer structure enables a flow of a current that is two or more times greater than a current flowing in a semiconductor layer having a single-layer structure.

FIGS. 6A to 6I are cross-sectional views sequentially illustrating a manufacturing method of a display apparatus, according to an embodiment. In FIGS. 6A to 6I, the same or like reference symbols as those in FIG. 3 denote the same or like elements.

Figure 6A:
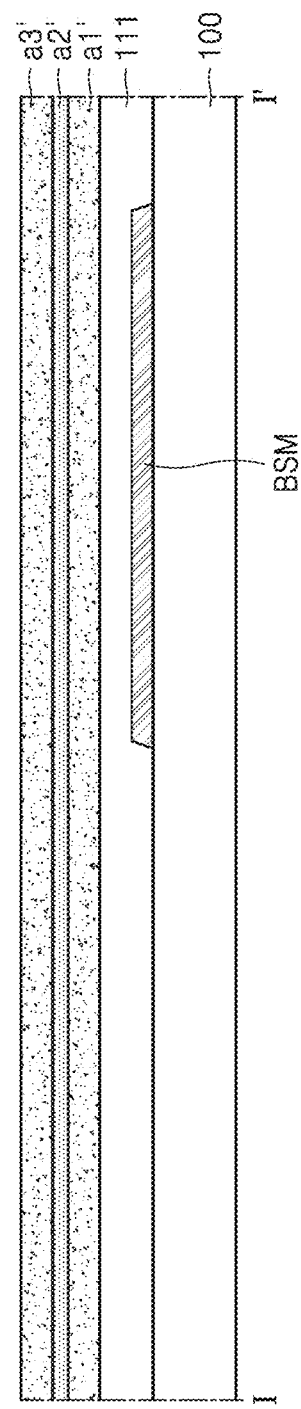

In an embodiment of a manufacturing method of a display apparatus, referring to FIG. 6A, after the bias electrode BSM is provided or formed on a region of the substrate 110 where the driving thin film transistor T1 is formed, the buffer layer 111 is provided or formed on the entire substrate 100. The bias electrode BSM may be formed after a conductive layer is deposited by one of various deposition methods such as a chemical vapor deposition method, a sputtering method, and an atomic layer deposition ("ALD") method and then is patterned. The buffer layer 111 may be an inorganic insulating layer and may be formed according to a chemical vapor deposition method, a sputtering method, an ALD method, or the like.

In such an embodiment, a first semiconductor material layer a1', a second semiconductor material layer a2', and a third semiconductor material layer a3' are sequentially provided or formed on the buffer layer 111.

The first semiconductor material layer a1' and the third semiconductor material layer a3' may each include at least one selected from indium gallium zinc oxide (InGaZnO), hafnium indium zinc oxide (HfInZnO), and hafnium zinc oxide (HfZnO).

The second semiconductor material layer a2' may include at least one selected from InZnO, GaZnO, AlZnO, InSnGaO, InSnZnO, and InSnGaZnO. In an embodiment, the second semiconductor material layer a2' may include at least one of various oxide semiconductors having a greater conductivity than that of the first semiconductor material layer a1'.

A thickness t2 of the second semiconductor material layer a2' may be less than a thickness t1 of the first semiconductor material layer a1' and a thickness t3 of the third semiconductor material layer a3'. In an embodiments, the thickness t2 of the second semiconductor material layer a2' may be in a range from about 40 Å to about 70 Å, and the thickness t1 of the first semiconductor material layer a1' and the thickness t3 of the third semiconductor material layer a3' may each be in a range from about 100 Å to about 200 Å.

Figure 6B:
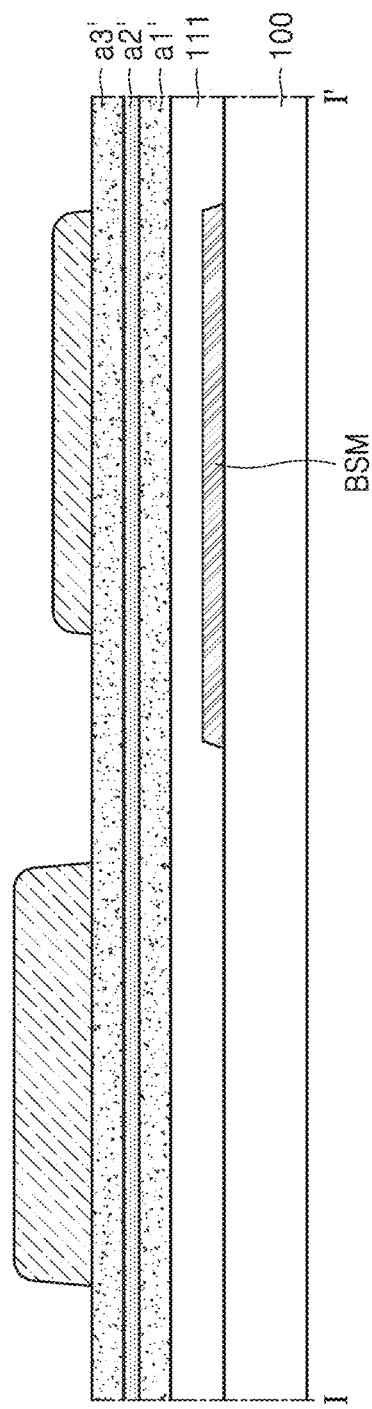

Referring to FIG. 6B, after a photosensitive film is provided or formed on the entire substrate 100 that is above the third semiconductor material layer a3', the photosensitive film is exposed by using a half-tone mask to form a first photosensitive pattern PR1 and a second photosensitive pattern PR2 having different thicknesses from each other.

The first photosensitive pattern PR1 may be in an area where the driving thin film transistor T1 is to be formed, and the second photosensitive pattern PR2 may be in an area where the switching thin film transistor T2 is to be formed. The thickness of the second photosensitive pattern PR2 may be greater than the thickness of the first photosensitive pattern PR1 by using a halftone mask process.

Figure 6C:
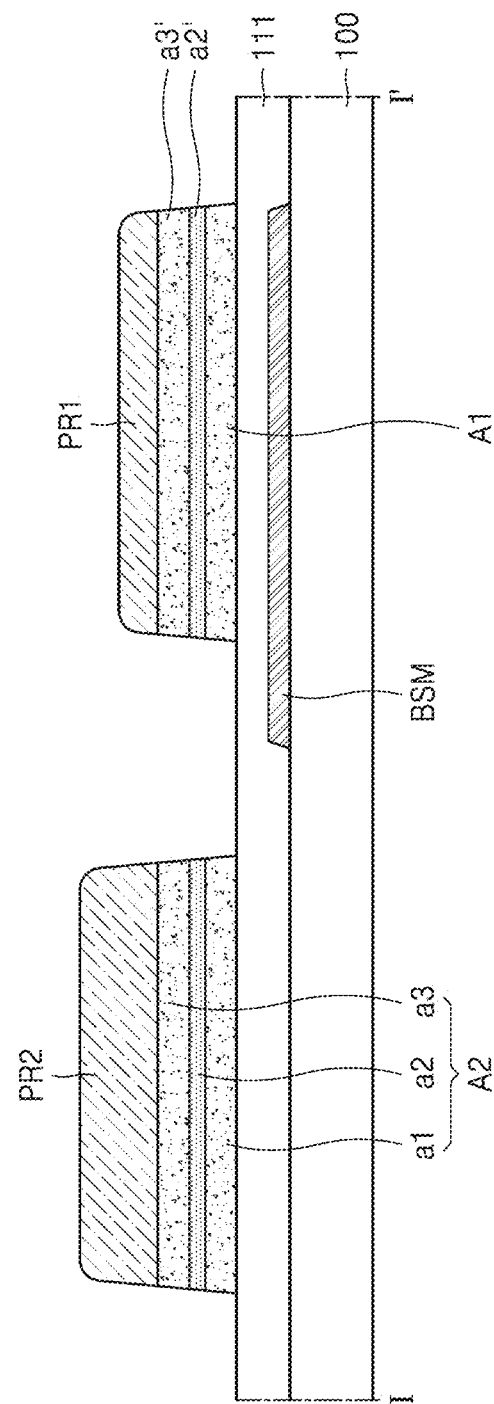

Referring to FIG. 6C, the first semiconductor material layer a1', the second semiconductor material layer a2', and the third semiconductor material layer a3' are etched by performing a first etching process. The first etching process is a process for etching the first semiconductor material layer a1', the second semiconductor material layer a2', and the third semiconductor material layer a3' by using the first and second photosensitive patterns PR1 and PR2 as masks and may be a wet etching process using an etchant. In an embodiment, the switching semiconductor layer A2 of the switching thin film transistor T2 and the driving semiconductor layer A1 of the driving thin film transistor T1 are formed by performing the first etching process.

Figure 6D:
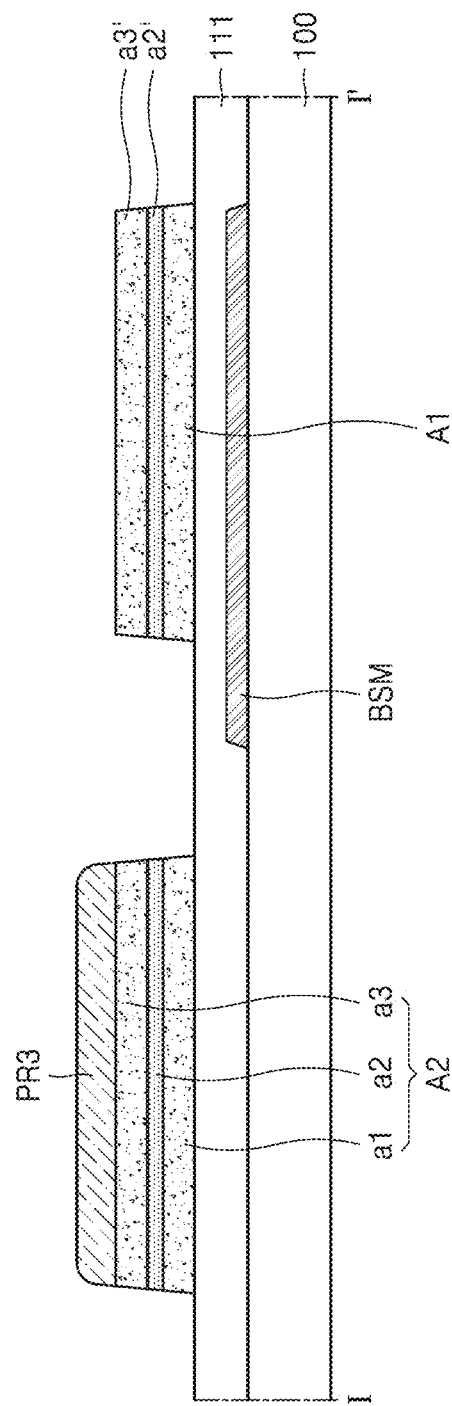

Referring to FIG. 6D, the first photosensitive pattern PR1 is removed from the area where the driving thin film transistor T1 is formed. The removal of the first photosensitive pattern PR1 may be performed by an ashing process. The ashing process is a process for removing a photosensitive pattern by generating plasma reacting to a photosensitive pattern. During the ashing process, the first photoconductive pattern PR1 may be removed, and the thickness of the second photoconductive pattern PR2 may decrease. Thus, a third photoconductive pattern PR3 may be formed. In an embodiment, a thickness of the third photoconductive pattern PR3 may be less than that of the second photoconductive pattern PR2.

Figure 6E:
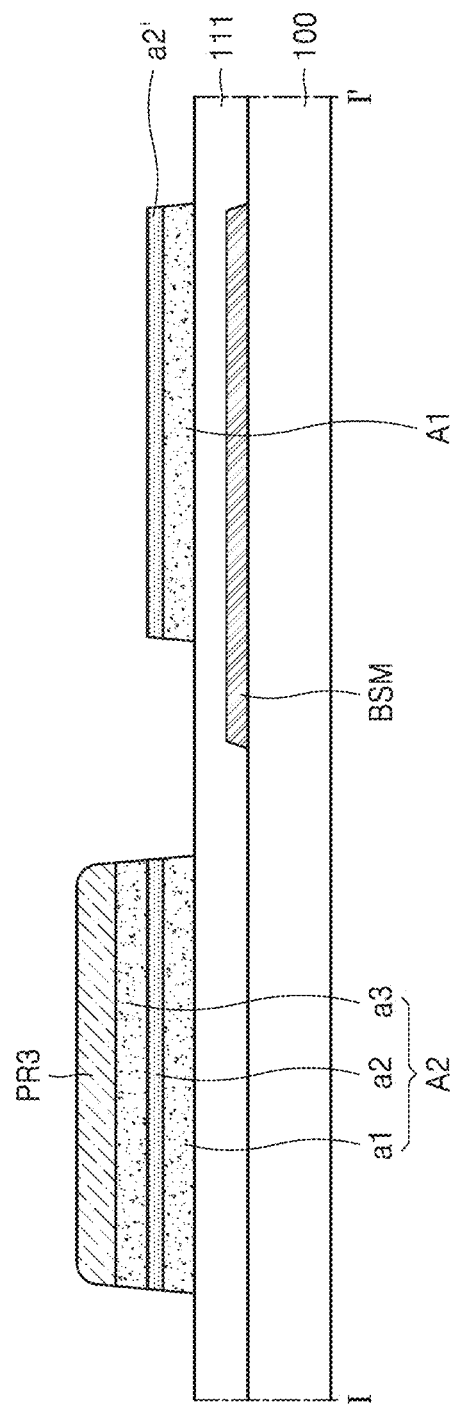

Then, by performing a second etching process, a third semiconductor material layer a3" on an upper portion of the driving semiconductor layer A1 is removed. The second etching process may be a wet etching process using an etchant having a selection ratio with regard to the third semiconductor material layer a3". In an embodiment, as shown in FIG. 6E, the third semiconductor material layer a3" may be removed from the upper portion of the driving semiconductor layer A1 by performing the second etching process, and a second semiconductor material layer a2" may remain.

Then, the second semiconductor material layer a2" on the upper portion of the driving semiconductor layer A1 is removed by performing a third etching process. The third etching process may be a dry etching process using an etching gas having a selection ratio with regard to the second semiconductor material layer a2". In the third etching process, the etching gas may be a gas including fluorine (F) such as $SF_6$, $CF_4$, $CHF_3$, $CHF_5$, or $C_4F_8$.

Figure 6F:
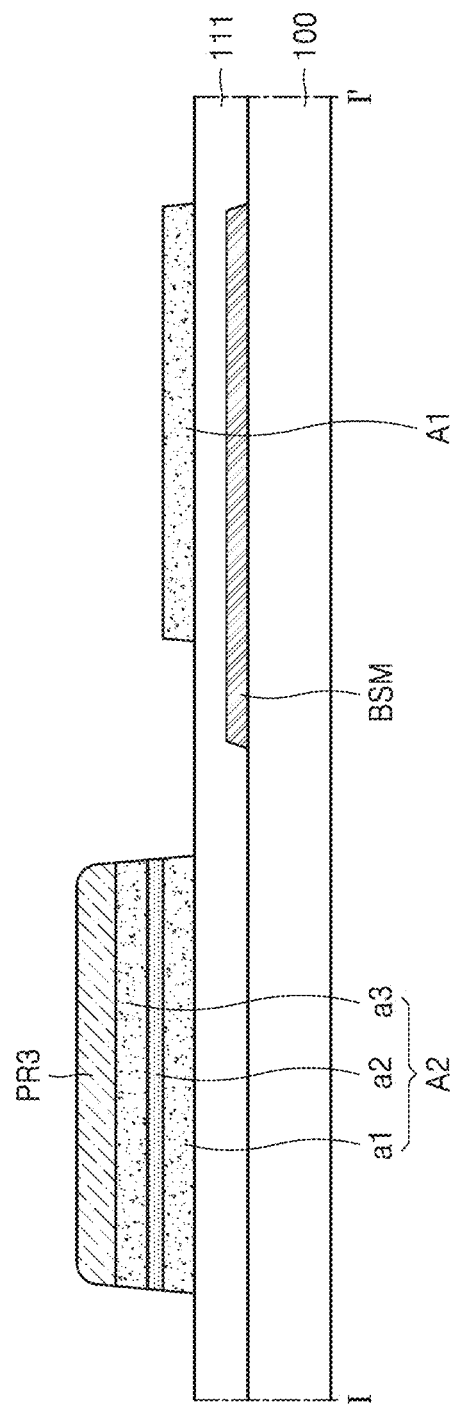

In an embodiment, as illustrated in FIG. 6F, the driving semiconductor layer A1 may be a single layer by performing the second and third etching processes. In an embodiment, the switching semiconductor layer A2 and the driving semiconductor layer A1 are formed by performing the first and third etching processes as one mask process, and thus, the number of mask processes may decrease.

Figure 6G:
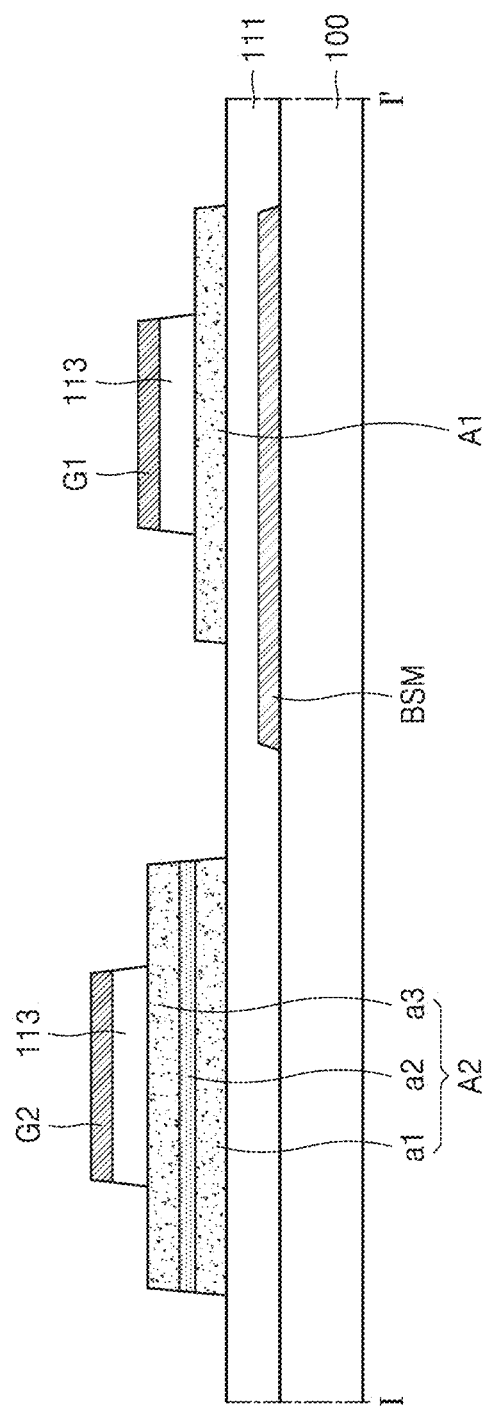

Referring to FIG. 6G, after the third photosensitive pattern PR3 is removed, the gate insulating layer 113 and the gate electrodes G1 and G2 are formed corresponding to the switching semiconductor layer A2 and the driving semiconductor layer A1. The gate insulating layer 113 may include an inorganic insulating material and may be formed by one of various deposition methods. The gate electrodes G1 and G2 may be conductive layers and may be formed by one of various deposition methods.

The gate insulating layer 113 and the gate electrodes G1 and G2 may be formed by a same mask process, and accordingly, the gate insulating layer 113 and the gate electrodes G1 and G2 may have a same pattern as each other.

Referring to FIG. 6H, the interlayer insulating layer 115 is provided or formed on the entire substrate 100 to cover the driving gate electrode G1 and the switching gate electrode G2. The interlayer insulating layer 115 may include an inorganic insulating material and may be formed by one of various deposition methods.

When the interlayer insulating layer 115 is formed, a thermal treatment process is performed. In an embodiment, hydrogen (H) included in the interlayer insulating layer 115 may disperse to the switching semiconductor layer A2 and the driving semiconductor layer A1. Because a carrier concentration in portions of the switching semiconductor layer A2, to which the hydrogen disperses from the interlayer insulating layer 115, increases because of hydrogen dispersion, the portions may have conductor properties and thus may become a switching source area and a switching drain area. In an embodiment, because a carrier concentration in portions of the driving semiconductor layer A1, to which the hydrogen disperses from the interlayer insulating layer 115, increases because of the hydrogen dispersion, the portions may have conductor properties and thus may become a driving source area and a driving drain area.

Then, the portions of the switching semiconductor layer A2, that is, the switching source area and the switching drain area, the portions of the driving semiconductor layer A1, that is, the driving source area and the driving drain area, and a contact hole CNT exposing the bias electrode BSM are formed in the interlayer insulating layer 115 through a mask process.

Figure 6I:
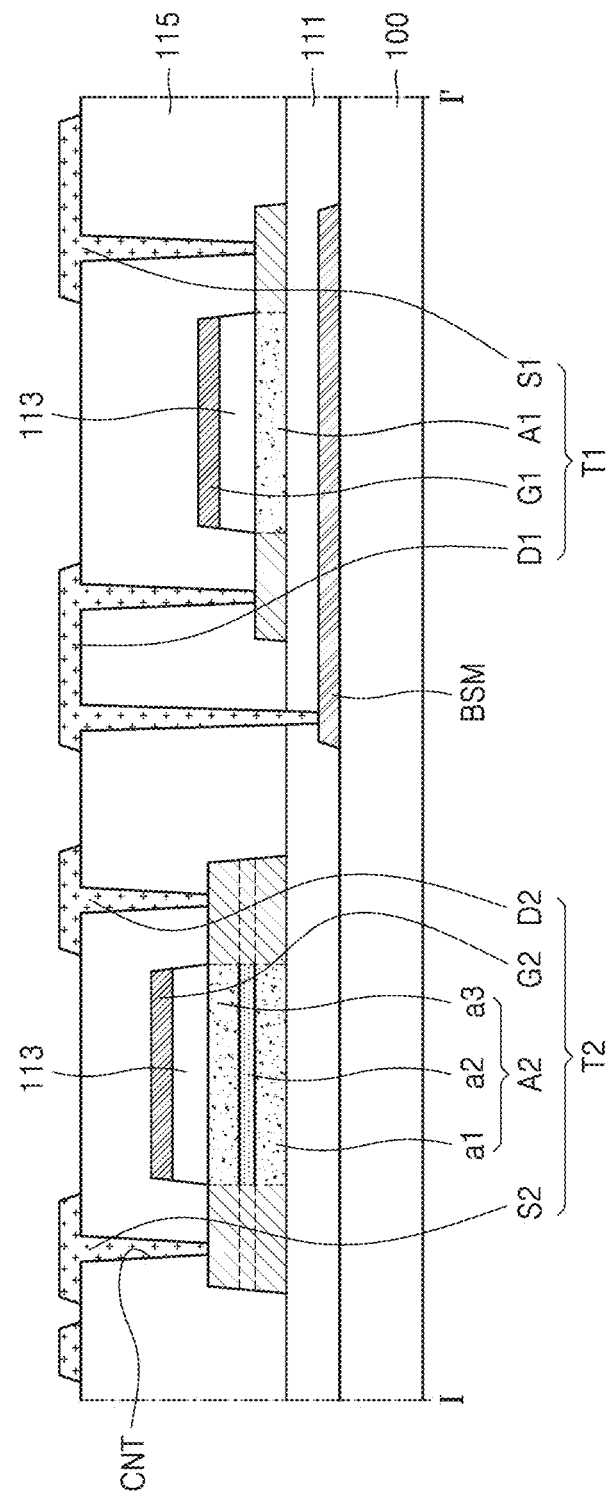

Referring to FIG. 6I, the driving source electrode S1, the driving drain electrode D1, the switching source electrode S2, and the driving drain electrode D2 are provided or formed on an upper portion of the interlayer insulating layer 115. The driving source electrode S1, the driving drain electrode D1, the switching source electrode S2, and the driving drain electrode D2 may be formed by depositing a conductive layer on the interlayer insulating layer 115 and patterning the conductive layer through a mask process.

In an embodiment, the driving source electrode S1 may be connected to the driving source area of the driving semiconductor layer A1 through the contact hole, and the driving drain electrode D1 may be connected to the driving drain area of the driving semiconductor layer A1 through the contact hole. The switching source electrode S2 may be connected to the switching source area of the switching semiconductor layer A2 through the contact hole, and the source drain electrode D2 may be connected to the switching drain area of the switching semiconductor layer A2. In such an embodiment, the driving drain electrode D1 may be connected to the bias electrode BSM through the contact hole.

Figure 6J:
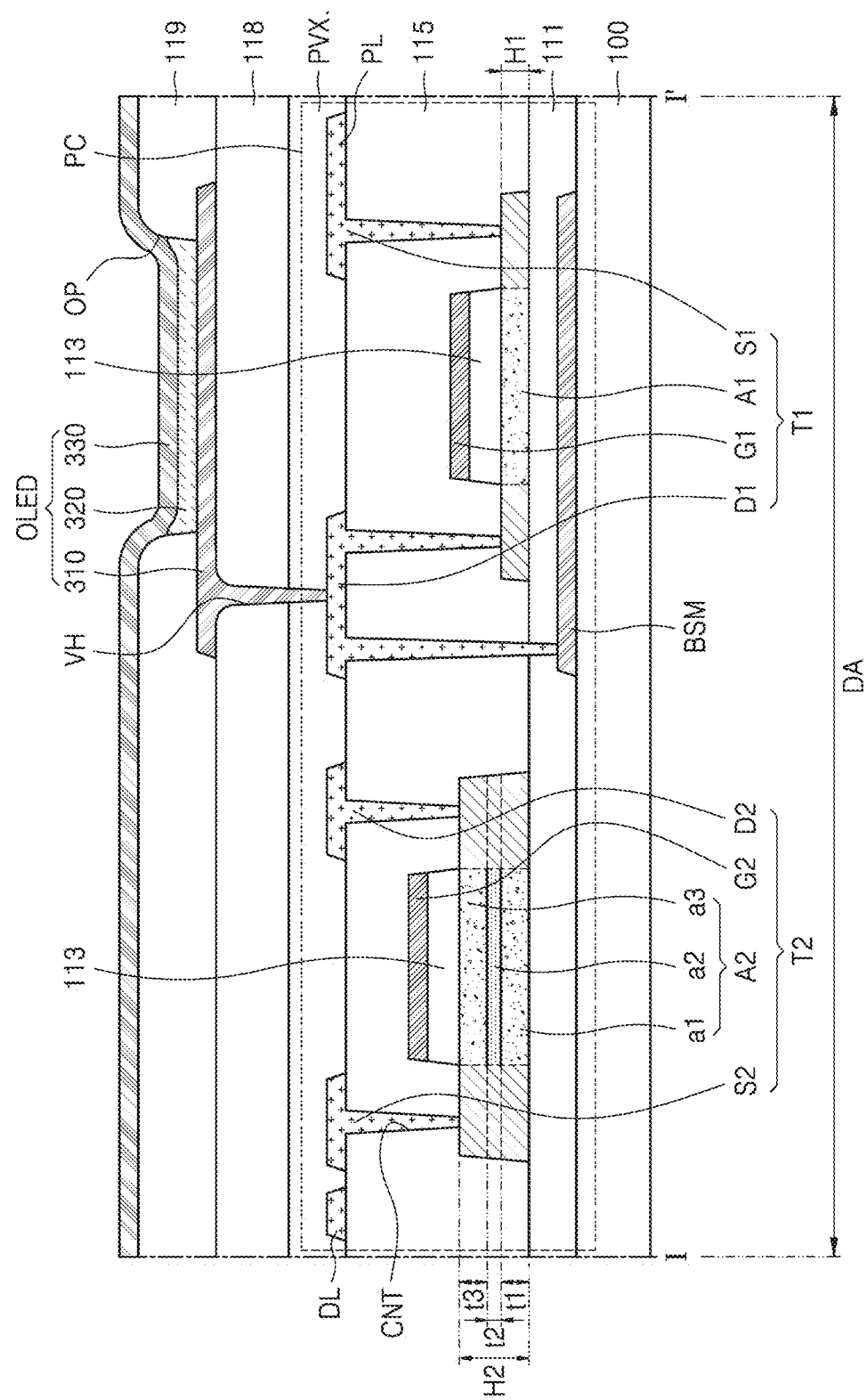

Referring to FIG. 6J, the protection layer PVX covering the driving source electrode S1, the driving drain electrode D1, the switching source electrode S2, and the driving drain electrode D2 and the planarization layer 118 may be provided or formed on the interlayer insulating layer 115. The protection layer PVX and the planarization layer 118 may include photosensitive materials and a via hole VH, which exposes the driving drain electrode D1, is formed through the protection layer PVX and the planarization layer 118 by performing exposing and hardening processes using a mask.

Then, the organic light-emitting diode OLED connected to the driving thin film transistor T1 through the via hole VH may be formed on the planarization layer 118.

Figure 7:
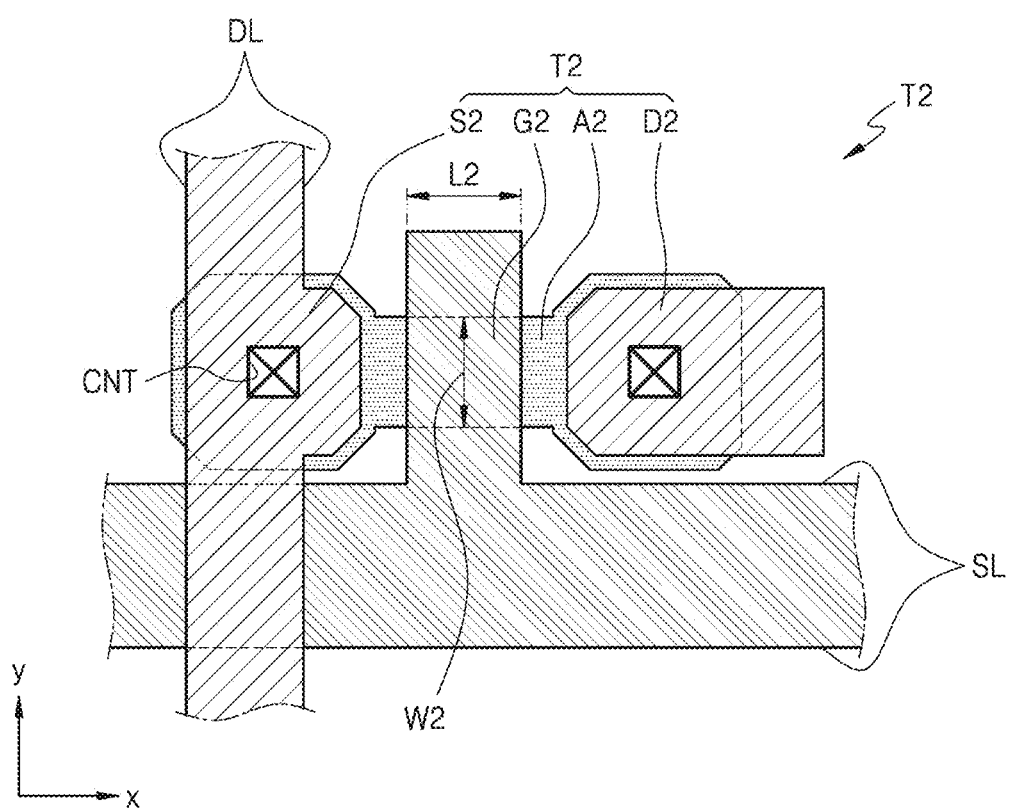
FIG. 7 is a plan view of a switching thin film transistor that may be applied to an embodiment.

FIG. 7 is a plan view of a switching thin film transistor that may be applied to an embodiment.

Referring to FIG. 7, the switching thin film transistor T2 may include the switching semiconductor layer A2, the switching gate electrode G2, the switching source electrode S2, and the switching drain electrode D2.

A channel length L2 and a channel width W2 of the switching semiconductor layer A2 may be defined in an area where the switching semiconductor layer A2 overlaps the gate electrode G2. The channel length L2 may be a length of the switching semiconductor layer A2 disposed between the source area and the drain area of the switching semiconductor layer A2, and as illustrated in FIG. 7, the channel length L2 may be a length of the gate electrode G2 in an x direction. The channel width W2 may be a length at which the gate electrode G2 overlaps the switching semiconductor layer A2 in a direction perpendicular to the channel length L2. In FIG. 7, the channel width W2 may be a length at which the gate electrode G2 overlaps the switching semiconductor layer A2 in a y direction.

In an embodiment, the switching semiconductor layer A2 may be a portion protruding in the y direction from the scan line SL extending in the x direction. In such an embodiment, the switching gate electrode G2 and the scan line SL may be integrally formed as a single unitary unit.

The switching source electrode S2 may be a portion of the data line DL extending in the y direction. The switching source electrode S2 may contact the source area of the switching semiconductor layer A2 through the contact hole CNT. The switching drain electrode D2 may be in a same layer or at a same level as the switching source electrode S2 and may contact the drain area of the switching semiconductor layer A2 through the contact hole CNT.

Figure 8A:
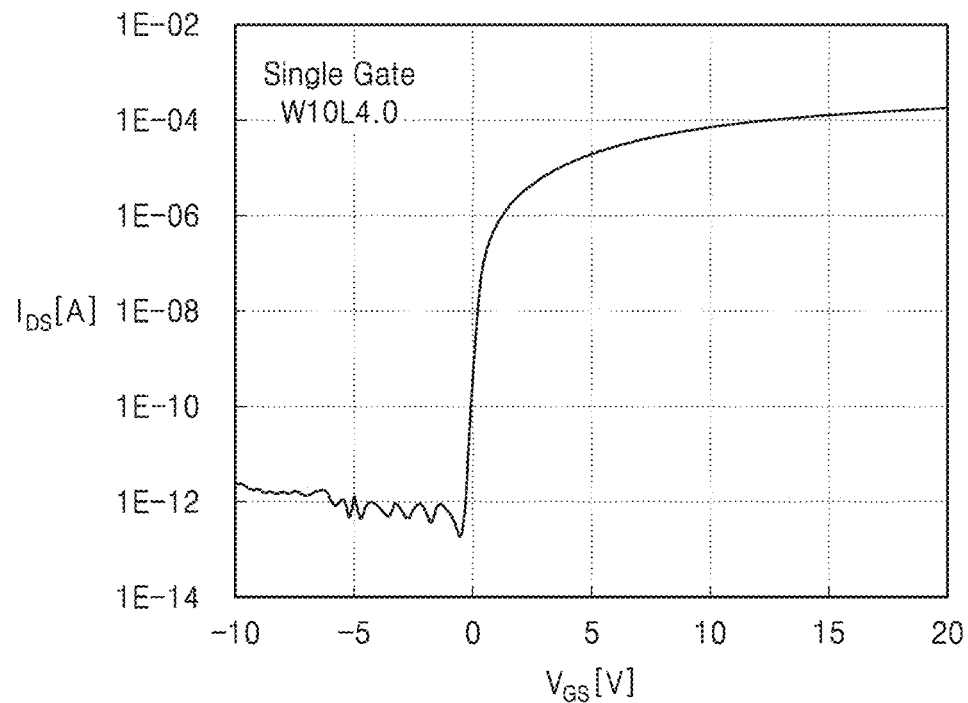
FIGS. 8A and 8B illustrate graphs of drain current ($I_{DS}$) versus gate voltage ($V_{GS}$) when a channel length of a thin film transistor having a single gate structure and including a semiconductor layer having a three-layer structure is changed.
Figure 8B:
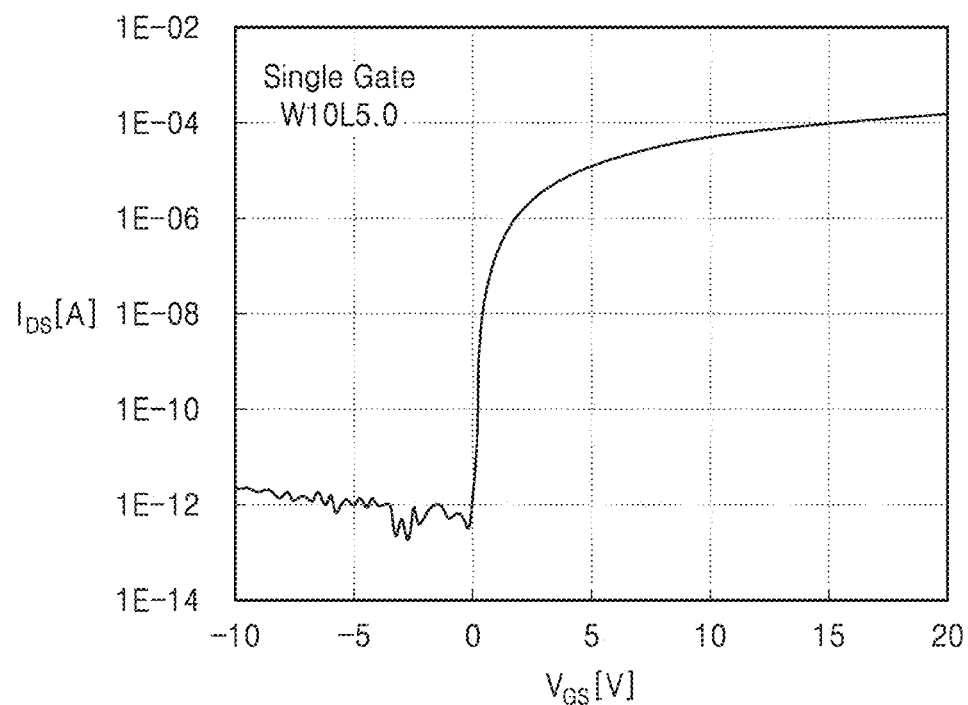

FIGS. 8A and 8B illustrate graphs of drain current $I_{DS}$ versus gate voltage $V_{GS}$ data when a channel length of a thin film transistor having a single gate structure and including a semiconductor layer having a three-layer structure is changed.

FIG. 8A is directed to case where a channel width W of the semiconductor layer is about 10 micrometers (μm), and a channel length L is about 4 μm. Referring to FIG. 8A, when the gate voltage $V_{GS}$ is about 15 V, the drain current $I_{DS}$ is about 1.3E-04 A.

FIG. 8B is directed to case where the channel width W of the semiconductor layer is about 10 μm, and the channel length L is about 5 μm. Referring to FIG. 8B, when the gate voltage $V_{GS}$ is about 15 V, the drain current $I_{DS}$ is about 1.3E-04 A.

Figure 9A:
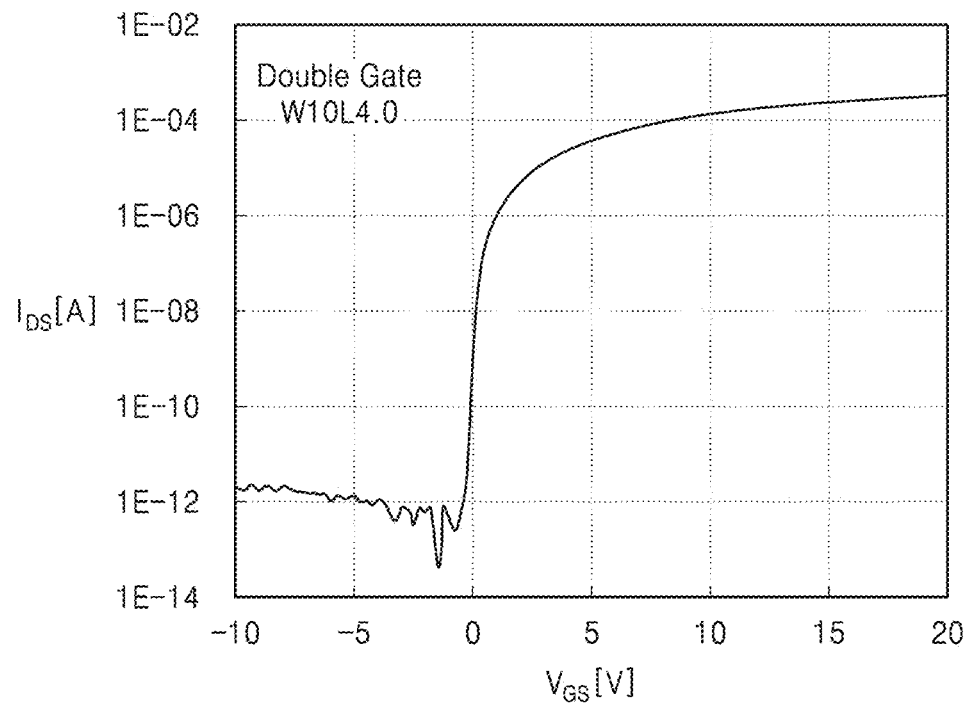
FIGS. 9A and 9B illustrate graphs of drain current ($I_{DS}$) versus gate voltage ($V_{GS}$) when a channel length of a thin film transistor having a double gate structure and including a semiconductor layer having a three-layer structure is changed.
Figure 9B:
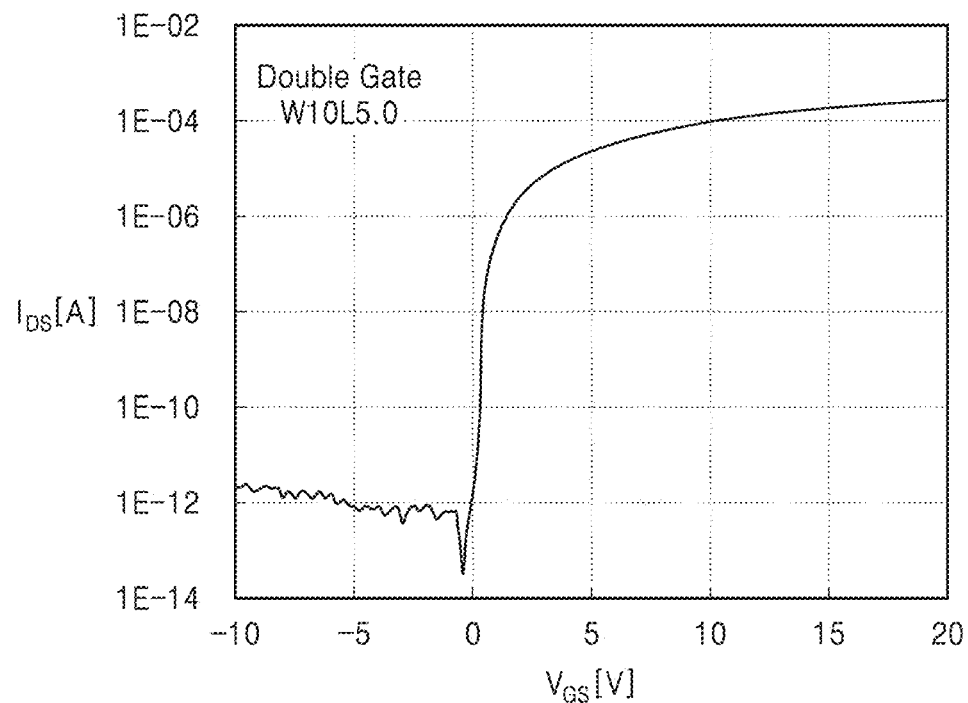

FIGS. 9A and 9B illustrate graphs of drain current $I_{DS}$ versus gate voltage $V_{GS}$ data when a channel length of a thin film transistor having a double gate structure and including a semiconductor layer having a three-layer structure is changed.

FIG. 9A is directed to case where the channel width W of the semiconductor layer is about 10 μm, and the channel length L is about 4 μm. Referring to FIG. 9A, when the gate voltage $V_{GS}$ is about 15 V, the drain current $I_{DS}$ is about 2.2E-04 A.

FIG. 9B is directed to case where the channel width W of the semiconductor layer is about 10 μm, and the channel length L is about 5 μm. Referring to FIG. 9B, when the gate voltage $V_{GS}$ is about 15 V, the drain current $I_{DS}$ is about 1.7E-04 A.

As illustrated in FIGS. 8A to 9B, in an embodiment, when the channel length L of the thin film transistor decreases from about 5 μm to about 4 μm, a value of the drain current $I_{DS}$ may increase without a short channel effect. In such an embodiment, the drain current $I_{DS}$ of the double-gate structure may have a greater value than that of the single-gate structure.

Accordingly, in an embodiment, even when the channel length L of a thin film transistor decreases, the electron mobility increases while other performances of the thin film transistor are maintained as described above.

Figure 10:
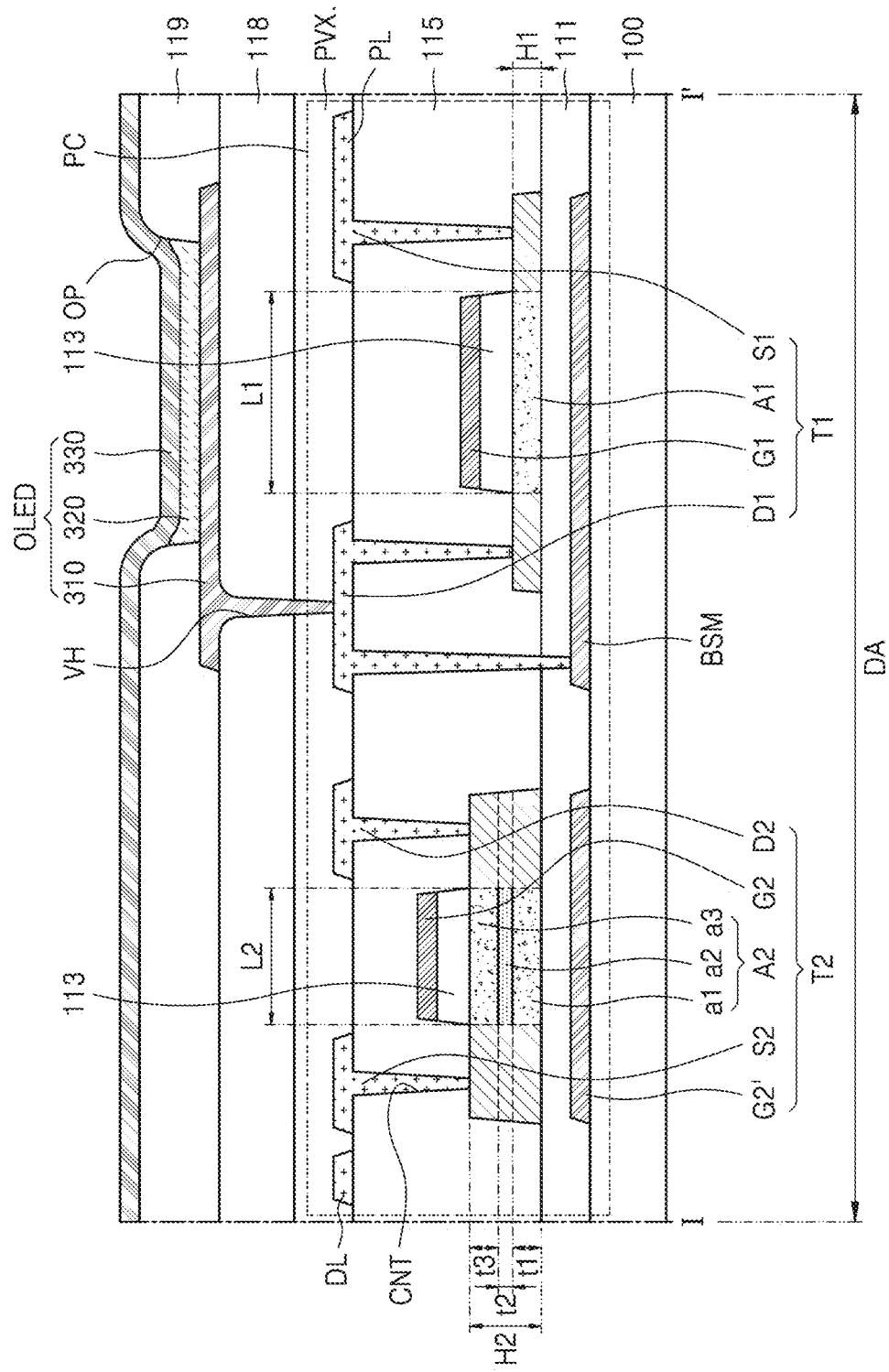
FIG. 10 is a schematic cross-sectional view of a display apparatus according to an embodiment.

FIG. 10 is a schematic cross-sectional view of a display apparatus according to an embodiment. In FIG. 10, the same or like reference symbols as those in FIG. 3 denote the same or like elements, and thus, any repeated detailed descriptions thereof will be omitted.

Referring to FIG. 10, an embodiment of the display apparatus includes the pixel circuit PC, which is in the display area DA of the substrate 100, and the organic light-emitting diode OLED connected to the pixel circuit PC as a display element. The pixel circuit PC includes the driving thin film transistor T1 and the switching thin film transistor T2.

The driving thin film transistor T1 may include the driving semiconductor layer A1 that has a single layer structure, and the switching thin film transistor T2 may include the switching semiconductor layer A2 that has a multilayered structure.

The switching thin film transistor T2 may include the switching semiconductor layer A2 in which the first layer a1, the second layer a2, and the third layer a3, which are oxide semiconductors, are sequentially stacked one on another, and the conductivity of the second layer a2 may be greater than the conductivities of the first layer a1 and the third layer a3.

In an embodiment, the first layer a1 and the third layer a3 may each include InGaZnO, and the second layer a2 may include at least one selected from InZnO, GaZnO, AlZnO, InSnGaO, InSnZnO, and InSnGaZnO.

In an embodiment, in the switching semiconductor layer A2, the second layer a2 having the high conductivity may be disposed between the first layer a1 and the third layer a3, and thus, the switching thin film transistor T2 may have the high mobility.

In such an embodiment, the channel length L2 of the switching thin film transistor T2 may be less than the channel length L1 of the driving thin film transistor T1 (i.e., L2<L1).

In such an embodiment, as described above with reference to FIGS. 8A to 9B, the switching thin film transistor T2 may have reduced electron mobility while other performances thereof are maintained despite a decrease in the channel length L2 of the switching semiconductor layer A2, and thus, an integration degree of the switching thin film transistor T2 may be improved by reducing the channel length L2.

Because it is desired to accurately adjust a driving range of the driving semiconductor layer A1, the channel length L1 of the driving semiconductor layer A1 may be greater than the channel length L2 of the switching semiconductor layer A2.

In an embodiment, the switching thin film transistor T2 may have a double-gate structure. In such an embodiment, a lower gate electrode G2' may overlap a lower portion of the switching semiconductor layer A2. The lower gate electrode G2' may include a same material and be at a same level as the bias electrode BSM. The lower gate electrode G2' may be electrically connected to the switching gate electrode G2. In such an embodiment, the switching thin film transistor T2 has the double-gate structure, such that the switching thin film transistor T2 may have the higher electron mobility.

Figure 11:
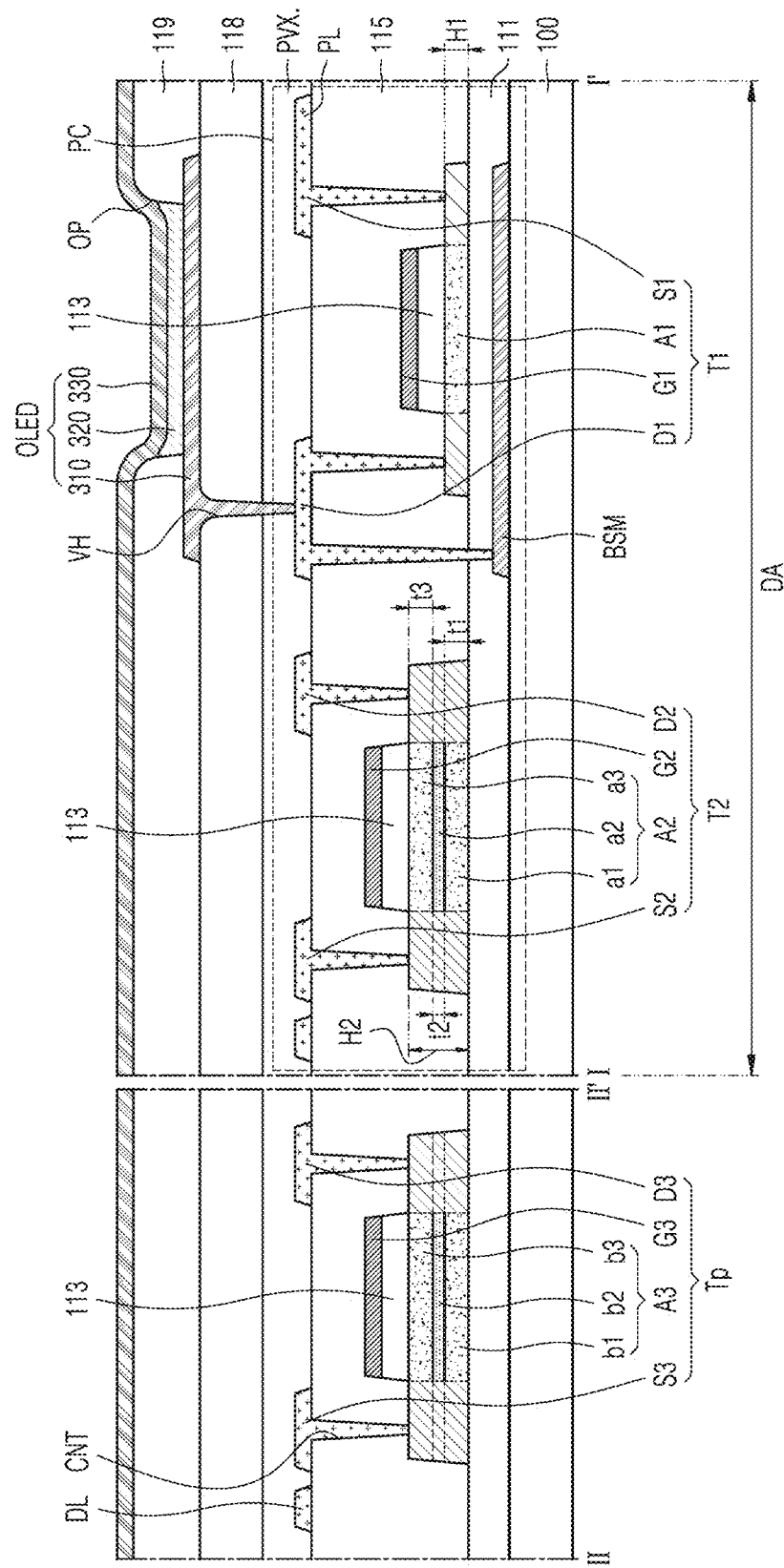
FIG. 11 is a schematic cross-sectional view of a display apparatus according to an embodiment.
Figure 12:
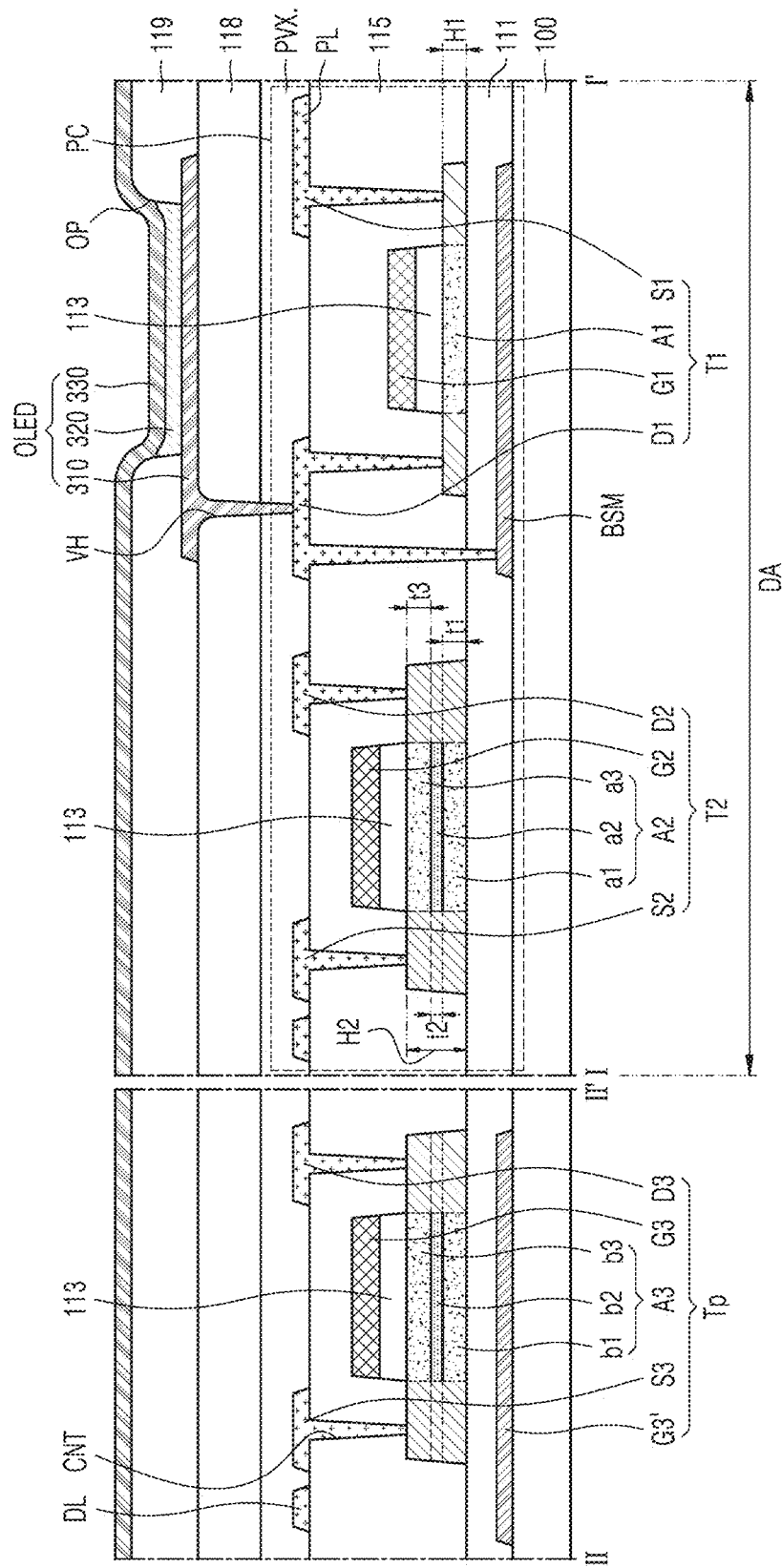
FIG. 12 is a schematic cross-sectional view of a display apparatus according to an alternative embodiment.
Figure 13:
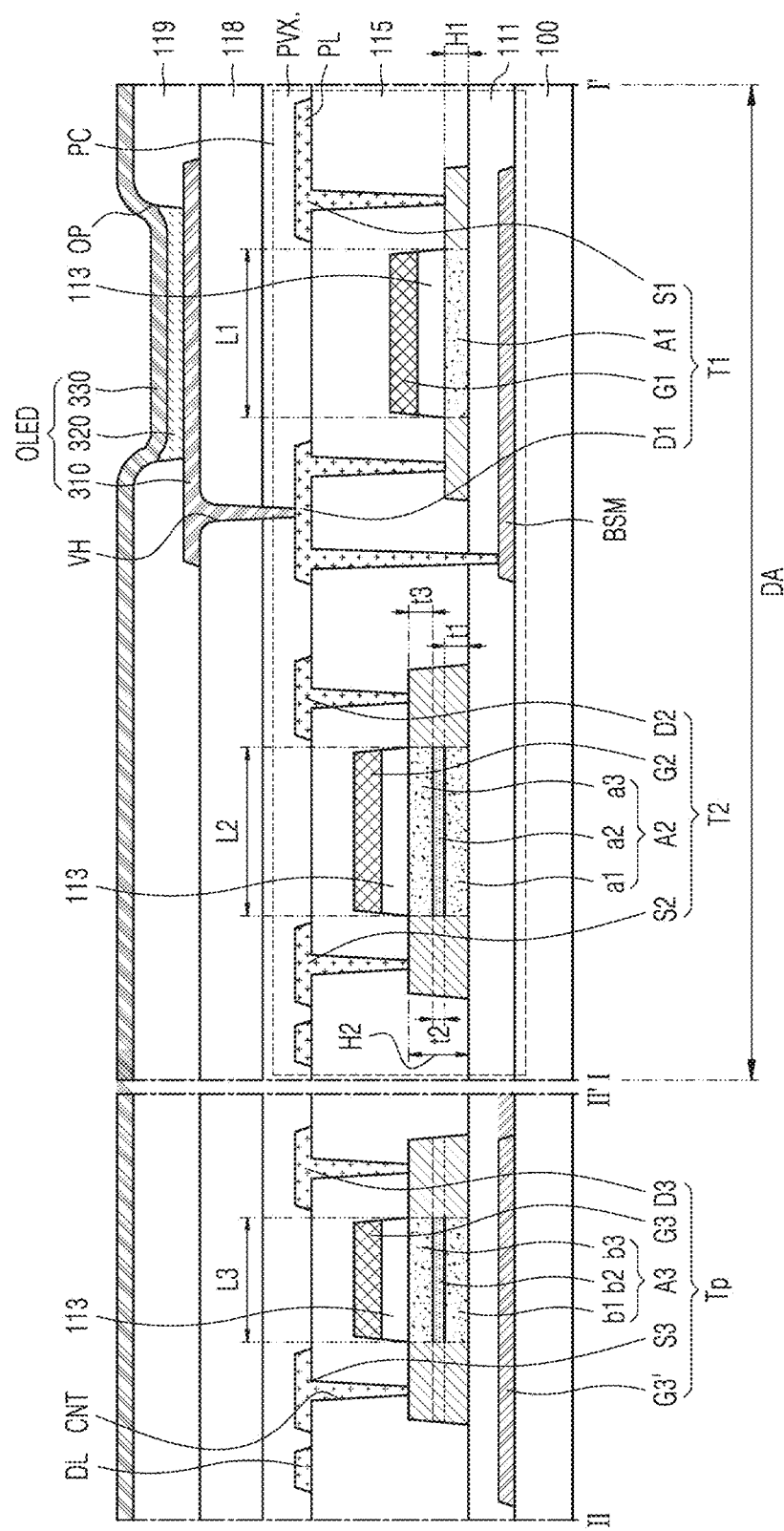
FIG. 13 is a schematic cross-sectional view of a display apparatus according to another alternative embodiment.

FIGS. 11 to 13 are schematic cross-sectional views of a display apparatus according to embodiments, taken along line I-I' and line II-II' of FIG. 1. In FIGS. 11 to 13, the same or like reference symbols as those in FIG. 3 denote the same or like elements, and thus, any repeated detailed descriptions thereof will be omitted.

Referring to FIG. 11, an embodiment of the display apparatus includes the display area DA and the peripheral area PA of the substrate 100. In such an embodiment, the pixel circuit PC, which includes the driving thin film transistor T1 and the switching thin film transistor T2, and the organic light-emitting diode OLED connected to the pixel circuit PC as the display element are arranged on the substrate 100 in the display area DA. In an embodiment, a peripheral thin film transistor Tp included in the embedded driving circuit (40 of FIG. 1) is disposed in the peripheral area PA.

The driving thin film transistor T1 may include the driving semiconductor layer A1 that has a single layer structure, and the switching thin film transistor T2 may include the switching semiconductor layer A2 that has the multilayered structure.

In an embodiment, the peripheral thin film transistor Tp may include a peripheral semiconductor layer A3 having a multilayered structure. The peripheral thin film transistor Tp may be simultaneously formed with the driving and switching thin film transistors T1 and T2 included in the pixel circuit PC, and the peripheral semiconductor layer A3 of the peripheral thin film transistor Tp may include a same material as the switching semiconductor layer A2 of the switching thin film transistor T2.

In such an embodiment, the peripheral thin film transistor Tp may include the peripheral semiconductor layer A3 in which a first layer b1, a second layer b2, and a third layer b3, which are oxide semiconductors, are sequentially stacked one on another, and the conductivity of the second layer b2 may be greater than the conductivities of the first and third layers b1 and b3.

In an embodiment, the first and third layers b1 and b3 may each include InGaZnO, and the second layer b2 may include at least one selected from InZnO, GaZnO, AlZnO, InSnGaO, InSnZnO, and InSnGaZnO.

The gate insulating layer 113 may overlap a peripheral gate electrode G3 on the upper portion of the peripheral semiconductor layer A3, and a source electrode S3 and a drain electrode D3 may be connected to source and drain areas on both opposing sides of the peripheral semiconductor layer A3.

In an embodiment, the second layer b2 having the great conductivity is disposed between the first layer b1 and the third layer b3 in the peripheral semiconductor layer A3, such that the peripheral thin film transistor Tp may have the high electron mobility. Accordingly, in such an embodiment, as the peripheral semiconductor layer A3 may have the multi-layered structure, the peripheral semiconductor layer A3 may have a same electron mobility even though a channel length of the peripheral semiconductor layer A3 is less than a channel length of a semiconductor layer having a single-layer structure. That is, an area of the peripheral area PA may decrease.

FIG. 11 illustrates an alternative embodiment where the peripheral thin film transistor Tp has a single gate structure, but embodiments are not limited thereto.

In another alternative embodiment, as illustrated in FIG. 12, the peripheral thin film transistor Tp may further include a lower peripheral gate electrode G3' on a lower portion of the peripheral semiconductor layer A3. In such an embodiment, the lower peripheral gate electrode G3' may be electrically connected to the peripheral gate electrode G3. The lower peripheral gate electrode G3' may include a same material and be at a same level as the bias electrode BSM.

Referring to FIG. 13, in an embodiment, a channel length L3 of the peripheral semiconductor layer A3 may not be the same as the channel length L1 of the driving semiconductor layer A1 and the channel length L2 of the switching semiconductor layer A2. In an embodiment, the channel length L3 of the peripheral semiconductor layer A3 may be variously modified. In one embodiment, for example, the channel length L3 of the peripheral semiconductor layer A3 may be less than the channel length L2 of the switching semiconductor layer A2 or may be less than the channel length L1 of the driving semiconductor layer A1. Accordingly, the area of the peripheral area PA may decrease.

Figure 14:
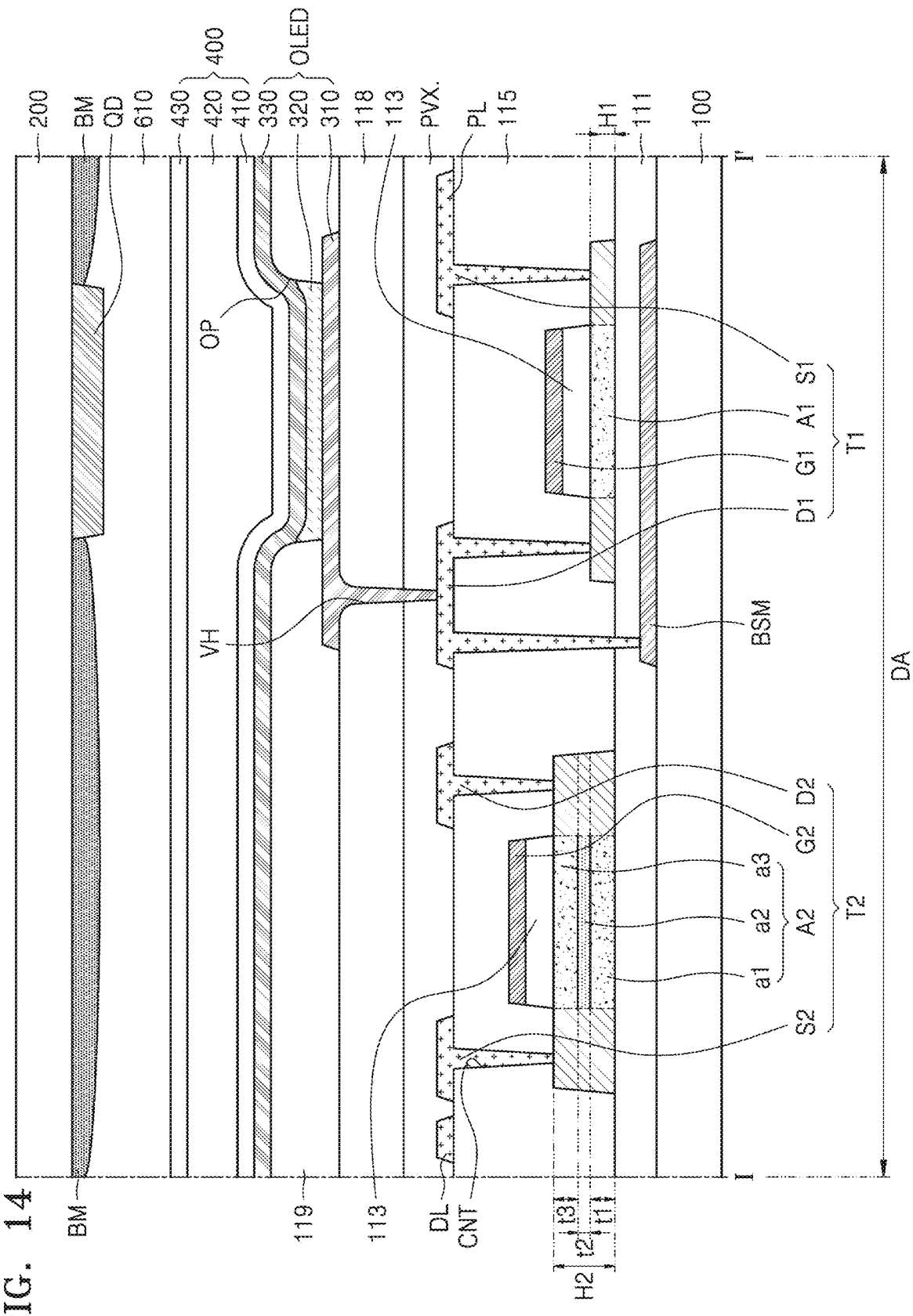
FIG. 14 is a schematic cross-sectional view of a display apparatus according to an embodiment.

FIG. 14 is a schematic cross-sectional view of a display apparatus according to an embodiment. In FIG. 14, the same or like reference symbols as those in FIG. 3 denote the same or like elements, and thus, any repeated detailed descriptions thereof will be omitted.

Referring to FIG. 14, an embodiment of the display apparatus includes the pixel circuit PC in the pixel area DA of the substrate 100, and the organic light-emitting diode OLED connected to the pixel circuit PC as the display element. The pixel circuit PC includes the driving thin film transistor T1 and the switching thin film transistor T2.

The driving thin film transistor T1 may include the driving semiconductor layer A1 that has a single layer structure, and the switching thin film transistor T2 may include the switching semiconductor layer A2 that has the multilayered structure.

The switching thin film transistor T2 may include the switching semiconductor layer A2 in which the first layer a1, the second layer a2, and the third layer a3, which are oxide semiconductors, are sequentially stacked one on another, and the conductivity of the second layer a2 may be greater than the conductivities of the first layer a1 and the third layer a3.

In an embodiment, the first layer a1 and the third layer a3 may each include InGaZnO, and the second layer a2 may include at least one selected from InZnO, GaZnO, AlZnO, InSnGaO, InSnZnO, and InSnGaZnO.

In an embodiment, the display apparatus may further include a thin film encapsulation layer 400 covering the organic light-emitting diode OLED, a color conversion layer QD on the thin film encapsulation layer 400, and an upper substrate 200 including a light barrier pattern BM.

The organic light-emitting diode OLED may be easily damaged by external moisture, oxygen, or the like and thus may be covered and protected by the thin film encapsulation layer 400. The thin film encapsulation layer 400 may cover the display area DA and extend to the outside of the display area DA. The thin film encapsulation layer 400 includes at least one organic encapsulation layer and at least one inorganic encapsulation layer. In one embodiment, for example, the thin film encapsulation layer 400 may include a first inorganic encapsulation layer 410, an organic encapsulation layer 420, and a second inorganic encapsulation layer 430.

The first inorganic encapsulation layer 410 may cover the opposite electrode 330 and include $SiO_2$, $SiN_x$, SiON, or the like. Although not illustrated, in an alternative embodiment, another layer such as a capping layer may be disposed between the first inorganic encapsulation layer 410 and the opposite electrode 330. Because the first inorganic encapsulation layer 410 is formed in a shape corresponding to a structure thereunder, an upper surface of the first inorganic encapsulation layer 410 may not be flat. The organic encapsulation layer 420 may cover the first inorganic encapsulation layer 410, and unlike the first inorganic encapsulation layer 410, an upper surface of the organic encapsulation layer 420 may be approximately flat. In such an embodiment, the upper surface of the organic encapsulation layer 420 may be approximately flat in a portion of the upper surface that corresponds to the display area DA. The organic encapsulation layer 420 may include at least one material selected from polyethylene terephthalate, polyethylene naphthalate, polycarbonate, polyimide, polyethylene sulfonate, polyoxymethylene, polyarylate, and HMDSO. The second inorganic encapsulation layer 430 may cover the organic encapsulation layer 420 and include $SiO_2$, $SiN_x$, SiON, or the like.

When a crack occurs in the thin film encapsulation layer 400 because of the above-described multilayered structure, the thin film encapsulation layer 400 may prevent such a crack from propagating between the first inorganic encapsulation layer 410 and the organic encapsulation layer 420 or between the organic encapsulation layer 420 and the second inorganic encapsulation layer 430. In such an embodiment, the generation of a path, through which external moisture, oxygen, or the like penetrates into the display area DA, may be prevented or decrease.

In an embodiment, the upper substrate 200 facing the substrate 100 may be disposed on the thin film encapsulation layer 400. In an embodiment, the color conversion layer QD and the light barrier pattern BM may be disposed on the upper substrate 200.

The color conversion layer QD may be a layer that makes a color of light emitted from the organic light-emitting diode OLED be clear or converts the color into another color. The color conversion layer QD may be a quantum conversion layer including quantum dots.

Quantum dots are semiconductor particles of which a diameter is in a range from about 2 nanometers (nm) to about 10 nm, having unique optical and electrical properties. When exposed to light, the quantum dots may emit light in a certain frequency according to sizes of particles, types of materials, and the like. In one embodiment, for example, when receiving light, the quantum dots may emit red light, green light, and blue light according to the sizes of particles and/or the types of materials.

In an embodiment, a quantum dot may have a core-shell structure including a core including nano-particles and a shell surrounding the core. The core of the quantum dot may be selected from the group consisting of a group II-VI compound, a group III-V compound, a group IV-VI compound, a group IV element, a group IV compound, and a combination thereof. The shell of the quantum dot may function as a protection layer for maintaining semiconductor properties by preventing a chemical modification of the core and/or a charging layer for providing electrophoresis properties to the quantum dot. The shell may have a single layer structure or a multilayer structure. An interface of the core and the shell may have a concentration gradient in which a concentration of elements existing in the shell decreases to the center. In one embodiment, for example, the shell of the quantum dot may include metal oxide, non-metal oxide, a semiconductor compound, or a combination thereof.

At least a portion of the color conversion layer QD may correspond to the emission area defined by the opening OP of the pixel-defining layer 119. In emission areas of some pixels, a color conversion layer may not correspond, and a light penetration window (not illustrated) may not be disposed. The light penetration window may include an organic material through which light may be emitted without any change in wavelengths of light emitted from the organic light-emitting diode OLED.

The color conversion layer QD and the light penetration window may be provided in plural, corresponding to the emission areas. The light barrier pattern BM may be disposed in gaps between the color conversion layers QD. The light barrier pattern BM may be a black matrix and may improve the color clarity and contrast. The light barrier pattern BM may be disposed between the emission areas of respective pixels. Because the light barrier pattern BM may include a black matrix absorbing visible rays, the light barrier pattern BM may prevent a color mixture of light emitted from the emission areas of neighboring pixels and may improve the visibility and contrast.

A filler 610 may be further disposed between the substrate 100 and the upper substrate 200. The filler 610 may function as a buffer for external impact, etc. The filler 610 may include an organic material such as methyl silicone, phenyl silicone, or polyimide. However, embodiments are not limited thereto. The filler 610 may include urethane-based resin, epoxy-based resin, acryl-based resin, which are organic sealants, silicon that is an inorganic sealant, or the like.

Although not illustrated, color filters may be additionally arranged to correspond to the color conversion layer QD to implement full-color images and improve the color purity and outdoor visibility.

In embodiments of the invention, as described above, a switching thin film transistor or a peripheral thin film transistor includes a semiconductor layer having a multilayered structure including oxide semiconductors, such that the integration degree may be improved, and high performance may be secured.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display apparatus comprising:
a substrate comprising a display area and a peripheral area outside the display area;
a pixel circuit disposed on the substrate in the display area, wherein the pixel circuit comprises a driving thin film transistor and a switching thin film transistor; and
a display element connected to the pixel circuit,
wherein the driving thin film transistor comprises a driving semiconductor layer having a single layer structure,
the switching thin film transistor comprises a switching semiconductor layer in which a first layer, a second layer and a third layer, which are oxide semiconductors, are sequentially stacked one on another, wherein the second layer is disposed between the first layer and the third layer, and
a conductivity of the second layer of the switching semiconductor layer is greater than respective conductivities of the first layer and the third layer of the switching semiconductor layer.

2. The display apparatus of claim 1, wherein the first layer of the switching semiconductor layer comprises a same material as the third layer of the switching semiconductor layer.

3. The display apparatus of claim 1, wherein the second layer of the switching semiconductor layer comprises at least one selected from indium zinc oxide (InZnO), gallium zinc oxide (GaZnO), aluminum zinc oxide (AlZnO), indium tin gallium oxide (InSnGaO), indium tin zinc oxide (InSnZnO), and indium tin gallium zinc oxide (InSnGaZnO).

4. The display apparatus of claim 1, wherein the driving semiconductor layer comprises a same material as the first layer of the switching semiconductor layer.

5. The display apparatus of claim 1, wherein a thickness of the second layer of the switching semiconductor layer is less than respective thicknesses of the first layer and the third layer of the switching semiconductor layer.

6. The display apparatus of claim 1, wherein a resistivity of the second layer is in a range from about 350 $\mu\Omega m$ to about 990 $\mu\Omega m$.

7. The display apparatus of claim 1, wherein a channel length of the switching semiconductor layer is less than a channel length of the driving semiconductor layer.

8. The display apparatus of claim 1, further comprising:
a color conversion layer disposed to correspond to an emission area of the display element, wherein the color conversion layer comprises a quantum dot.

9. The display apparatus of claim 1, further comprising:
an embedded driving circuit disposed on the substrate in the peripheral area,
wherein the embedded driving circuit comprises a peripheral thin film transistor.

10. The display apparatus of claim 9, wherein
the peripheral thin film transistor comprises a peripheral semiconductor layer in which a first layer, a second layer, and a third layer, which are oxide semiconductors, are sequentially stacked one on another, and a conductivity of the second layer of the peripheral semiconductor layer is greater than respective conductivities of the first layer and the third layer of the peripheral semiconductor layer.

11. The display apparatus of claim 10, wherein the peripheral thin film transistor comprises a gate electrode disposed on an upper portion of the peripheral semiconductor layer and a lower gate electrode disposed on a lower portion of the peripheral semiconductor layer.

12. A display apparatus comprising:
- a substrate comprising a display area and a peripheral area outside the display area;
- a pixel circuit disposed on the substrate in the display area, wherein the pixel circuit comprises a driving thin film transistor;
- a display element connected to the pixel circuit; and
- an embedded driving circuit disposed on the substrate in the peripheral area, wherein the embedded driving circuit comprises a peripheral thin film transistor,
- wherein the driving thin film transistor comprises a driving semiconductor layer having a single layer structure,
- the peripheral thin film transistor comprises a peripheral semiconductor layer in which a first layer, a second layer, and a third layer, which are oxide semiconductors, are sequentially stacked one on another, wherein the second layer is disposed between the first layer and the third layer, and
- a conductivity of the second layer of the peripheral semiconductor layer is greater than respective conductivities of the first layer and the third layer of the peripheral semiconductor layer.

13. The display apparatus of claim 12, wherein the first layer of the peripheral semiconductor layer comprises a same material as the third layer of the peripheral semiconductor layer.

14. The display apparatus of claim 12, wherein the second layer of the peripheral semiconductor layer comprises at least one selected from indium zinc oxide (InZnO), gallium zinc oxide (GaZnO), aluminum zinc oxide (AlZnO), indium tin gallium oxide (InSnGaO), indium tin zinc oxide (InSnZnO), and indium tin gallium zinc oxide (InSnGaZnO).

15. The display apparatus of claim 12, wherein the driving semiconductor layer comprises a same material as the first layer of the peripheral semiconductor layer.

16. The display apparatus of claim 12, wherein a thickness of the second layer of the peripheral semiconductor layer is less than respective thicknesses of the first layer and the third layer of the peripheral semiconductor layer.

17. The display apparatus of claim 12, wherein the peripheral thin film transistor comprises a gate electrode disposed on an upper portion of the peripheral semiconductor layer, and a lower gate electrode disposed on a lower portion of the peripheral semiconductor layer.

18. The display apparatus of claim 12, wherein a channel length of the peripheral semiconductor layer is less than a channel length of the driving semiconductor layer.

19. The display apparatus of claim 12, wherein
the pixel circuit further comprises a switching thin film transistor, and
the switching thin film transistor comprises a switching semiconductor layer having a multilayered structure.

20. The display apparatus of claim 12, wherein the embedded driving circuit provides a scan signal to the pixel circuit.

* * * * *